(12) United States Patent
Lee et al.

(10) Patent No.: US 12,328,987 B2
(45) Date of Patent: Jun. 10, 2025

(54) DISPLAY DEVICE INCLUDING REFLECTION CONTROL LAYER HAVING UV ABSORBER

(71) Applicant: Samsung Display Co., LTD., Yongin-si (KR)

(72) Inventors: Mi Hwa Lee, Seoul (KR); Suk Hoon Kang, Seoul (KR); Jeong Myo Sim, Gangneung-si (KR); Kyung Hee Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 677 days.

(21) Appl. No.: 17/515,691

(22) Filed: Nov. 1, 2021

(65) Prior Publication Data

US 2022/0271262 A1 Aug. 25, 2022

(30) Foreign Application Priority Data

Feb. 23, 2021 (KR) .................. 10-2021-0023792

(51) Int. Cl.
*H10K 50/86* (2023.01)
*H10K 50/84* (2023.01)
(Continued)

(52) U.S. Cl.
CPC ......... *H10K 50/865* (2023.02); *H10K 50/844* (2023.02); *H10K 59/12* (2023.02);
(Continued)

(58) Field of Classification Search
CPC .... H10K 50/865; H10K 50/844; H10K 50/86; H10K 50/856; H10K 50/8445; H10K 50/15; H10K 50/16; H10K 59/12; H10K 59/40; H10K 59/121; H10K 59/1213; H10K 59/8792; H10K 59/873; H10K 59/126; H10K 77/111; H10K 2101/80;
(Continued)

(56) References Cited

U.S. PATENT DOCUMENTS 10,903,285 B2 * 1/2021 Kim .................. G06F 3/0412
10,915,210 B2 * 2/2021 Lee .................. G06F 3/0446
(Continued)

FOREIGN PATENT DOCUMENTS

| KR | 20200006206 A |   | 1/2020 |            |
|----|---------------|---|--------|------------|
| KR | 20200075950 A |   | 6/2020 |            |
| KR | 20210004006 A | * | 1/2021 | H10K 59/12 |

OTHER PUBLICATIONS

English Abstract of KR 20200006206, Jan. 20, 2020.
English Abstract of KR 20200075950, Jun. 29, 2020.

*Primary Examiner* — Ida M Soward
(74) *Attorney, Agent, or Firm* — CANTOR COLBURN LLP

(57) ABSTRACT

A display device is provided. The display device comprises a thin-film transistor layer disposed on a substrate, a light emitting element layer disposed on the thin-film transistor layer, a touch sensing layer disposed on the light emitting layer, and a reflection control layer disposed on the touch sensing layer, wherein the reflection control layer includes a UV absorber, wherein the UV absorber includes at least one hydrophobic group, and/or the UV absorber is present as a concentration gradient in the reflection control layer.

18 Claims, 18 Drawing Sheets

(51) Int. Cl.
*H10K 50/844* (2023.01)
*H10K 59/12* (2023.01)
*H10K 59/40* (2023.01)
*G06F 1/16* (2006.01)
*G09F 9/30* (2006.01)
*H10K 50/15* (2023.01)
*H10K 50/16* (2023.01)
*H10K 59/121* (2023.01)
*H10K 59/126* (2023.01)
*H10K 59/80* (2023.01)
*H10K 77/10* (2023.01)
*H10K 102/00* (2023.01)

(52) U.S. Cl.
CPC ........... *H10K 59/40* (2023.02); *G06F 1/1652* (2013.01); *G09F 9/301* (2013.01); *H10K 50/15* (2023.02); *H10K 50/16* (2023.02); *H10K 59/121* (2023.02); *H10K 59/1216* (2023.02); *H10K 59/126* (2023.02); *H10K 59/873* (2023.02); *H10K 59/8792* (2023.02); *H10K 77/111* (2023.02); *H10K 2102/311* (2023.02)

(58) Field of Classification Search
CPC ........... H10K 2102/311; H10K 59/131; H10K 59/878; H10K 59/8731; C09K 3/00; G06F 1/1652; G06F 3/0412; G06F 3/04164; G06F 3/0443; G06F 3/0446; G06F 2203/04111; G06F 2203/04112; G09F 9/301
See application file for complete search history.

(56) References Cited

U.S. PATENT DOCUMENTS

| | | | |
|---|---|---|---|
| 2005/0001963 A1* | 1/2005 | Yokoyama | H10K 50/805 349/122 |
| 2005/0186516 A1* | 8/2005 | Endo | G03F 7/2041 430/273.1 |
| 2006/0231830 A1* | 10/2006 | Matsuda | H10K 71/164 257/40 |
| 2006/0286889 A1* | 12/2006 | Nishi | H10K 50/814 445/24 |
| 2007/0207571 A1* | 9/2007 | Morisue | G02F 1/13394 257/E29.295 |
| 2008/0218071 A1* | 9/2008 | Kobayashi | H10K 59/876 313/506 |
| 2010/0194672 A1* | 8/2010 | Kim | G02B 5/223 430/7 |
| 2012/0231228 A1* | 9/2012 | Fujimori | C23C 14/048 219/121.69 |
| 2016/0307968 A1* | 10/2016 | Yoon | H10K 59/8792 |
| 2017/0141180 A1* | 5/2017 | Matsumoto | H10K 59/80522 |
| 2017/0351141 A1* | 12/2017 | Kubota | G02F 1/133305 |
| 2019/0018530 A1* | 1/2019 | Lee | H10K 50/8445 |
| 2019/0204952 A1* | 7/2019 | Han | G06F 3/041662 |
| 2019/0288043 A1* | 9/2019 | Shin | H10K 50/813 |
| 2020/0119113 A1* | 4/2020 | Lee | G06F 3/0446 |
| 2020/0194502 A1 | 6/2020 | Joo et al. | |
| 2020/0210006 A1* | 7/2020 | Son | H10K 50/844 |
| 2020/0212138 A1* | 7/2020 | Lee | H10K 50/818 |
| 2020/0343315 A1* | 10/2020 | Lin | H10K 50/11 |
| 2021/0232010 A1* | 7/2021 | Numata | G09F 9/00 |

* cited by examiner

DISPLAY DEVICE INCLUDING REFLECTION CONTROL LAYER HAVING UV ABSORBER

This application claims priority to Korean Patent Application No. 10-2021-0023792 filed on Feb. 23, 2021 in the Korean Intellectual Property Office, and all the benefits accruing therefrom under 35 U.S.C. § 119, the disclosure of which is herein incorporated by reference in its entirety.

BACKGROUND

1. Field of the Disclosure

The present disclosure relates to a display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

A display device includes an anti-reflection member such as a polarizing plate attached to a display panel in order to reduce reflection of external light by metal lines of the display panel. Recently, to reduce costs of fabrication research is ongoing to reduce the reflection of external light in the absence of the polarizing plate.

SUMMARY

Aspects of the present disclosure provide a display device that can reduce fabrication costs by simplifying the process.

It should be noted that objects of the present disclosure are not limited to the above-mentioned object; and other objects of the present disclosure will be apparent to those skilled in the art from the following descriptions.

According to embodiments of the present disclosure, it is possible to minimize or prevent the color and transmittance of the reflection control layer in a display device from being altered by sunlight.

According to embodiments of the present disclosure, a hydrophobic group is coupled to an UV absorber, and thus, the UV absorber can be positioned at the upper portion in the reflection control layer without any additional masking process. Accordingly, the fabrication costs of the display device can be reduced and the process can be simplified.

According to an embodiment of the present disclosure, the display device comprises a thin-film transistor layer disposed on a substrate, a light emitting element layer disposed on the thin-film transistor layer, a touch sensing layer disposed on the light emitting layer, and a reflection control layer disposed on the touch sensing layer, wherein the reflection control layer comprises an UV absorber with at least one hydrophobic group.

In an embodiment, the reflection control layer comprises an absorbing member comprising at least one of a dye or a pigment.

In an embodiment, the UV absorber includes a body having the at least one hydrophobic group coupled to the body, and the body comprises one or more of a benzophenone compound, a benzotriazole compound, a salicylate compound, a cyanoacrylate compound, or an oxanilide compound.

In an embodiment, the at least one hydrophobic group comprises at least one of an alkyl group or a fluoroalkyl group.

In an embodiment, the alkyl group is represented by Formula 1:

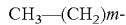
 Formula 1 wherein m is an integer equal to or greater than 12.

In an embodiment, the fluoroalkyl group is represented by Formula 2:

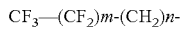
 Formula 2 wherein (m+n) is an integer equal to or greater than 3.

In an embodiment, the UV absorber is present in a range from 0.5 weight percent (wt %) to 5 wt % based on the total weight of the reflection control layer.

In an embodiment, the UV absorber is present as a concentration gradient in the reflection control layer, and the concentration of the UV absorber increases in a direction away from the touch sensing layer.

In an embodiment, the display device further comprises a patterned black matrix disposed between the touch sensing layer and the reflection control layer.

According to an embodiment of the present disclosure, the display device comprises a thin-film transistor layer disposed on a substrate, a light emitting element layer disposed on the thin-film transistor layer, a touch sensing layer disposed on the light emitting layer, and a reflection control layer disposed on the touch sensing layer, wherein the reflection control layer comprises a UV absorber, wherein the UV absorber is present as a concentration gradient in the reflection control layer, and the concentration of the UV absorber increases in a direction away from the touch sensing layer.

In an embodiment, the reflection control layer is disposed on an entire upper surface of the touch sensing layer.

In an embodiment, the light emitting element layer comprises a pixel electrode disposed on the thin-film transistor layer, a light emitting layer disposed on the pixel electrode, a common electrode disposed on the light emitting layer, and a light-absorbing layer disposed on the common electrode.

In an embodiment, the light-absorbing layer comprises a metal or a metal oxide.

In an embodiment, the display device further comprises an encapsulation layer disposed between the light emitting layer and the touch screen layer, wherein the encapsulation layer comprises a first inorganic encapsulation layer disposed on the common electrode and the light-absorbing layer, an organic encapsulation layer disposed on the first inorganic encapsulation layer, and a second inorganic encapsulation layer disposed on the organic encapsulation layer.

In an embodiment, the touch sensing layer is disposed on the second inorganic encapsulation layer and comprises a driving electrode, a sensing electrode, and a connection electrode.

In an embodiment, the UV absorber includes a body and at least one hydrophobic group coupled to the body, wherein the body comprises a benzophenone compound, i.e., a benzophenone-based compound, a benzotriazole compound, i.e., a benzotriazole-based compound, a salicylate compound, i.e., a salicylate-based compound, a cyanoacrylate compound, i.e., a cyanoacrylate-based compound, or an oxanilides compound, i.e., anoxanilide-based compound. As used herein, the term "-based" refers to a compound that includes the named moiety, e.g., a benzophenone.

In an embodiment, the at least one hydrophobic group comprises at least one of an alkyl group or a fluoroalkyl group.

In an embodiment, the alkyl group is represented by Formula 1:

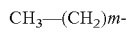
                                                                Formula 1 wherein m is an integer equal to or greater than 12.

In an embodiment, the fluoroalkyl group is represented by Formula 2:

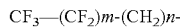
                                                                Formula 2 wherein (m+n) is an integer equal to or greater than 3.

In an embodiment, the UV absorber is present in a range from 0.5 wt % to 5 wt % based on the total weight of the reflection control layer.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
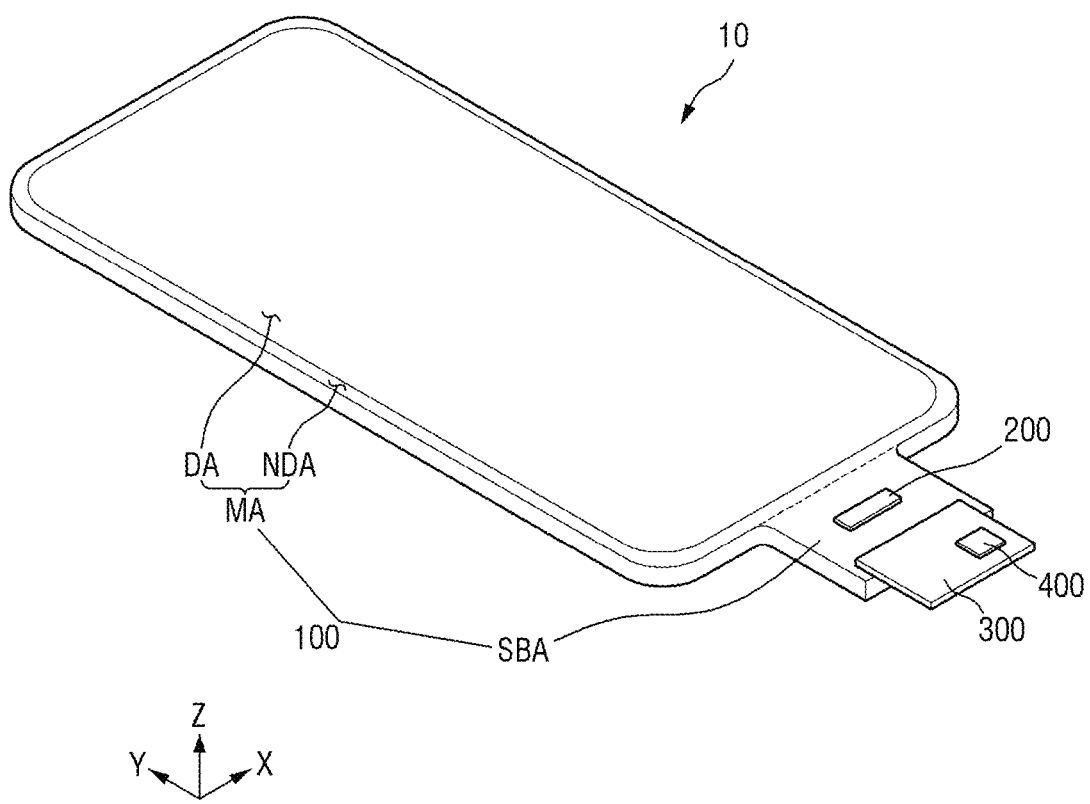
FIG. 1 is a perspective view showing a display device according to an embodiment of the present disclosure.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the accompanying drawings.

Figure 2:
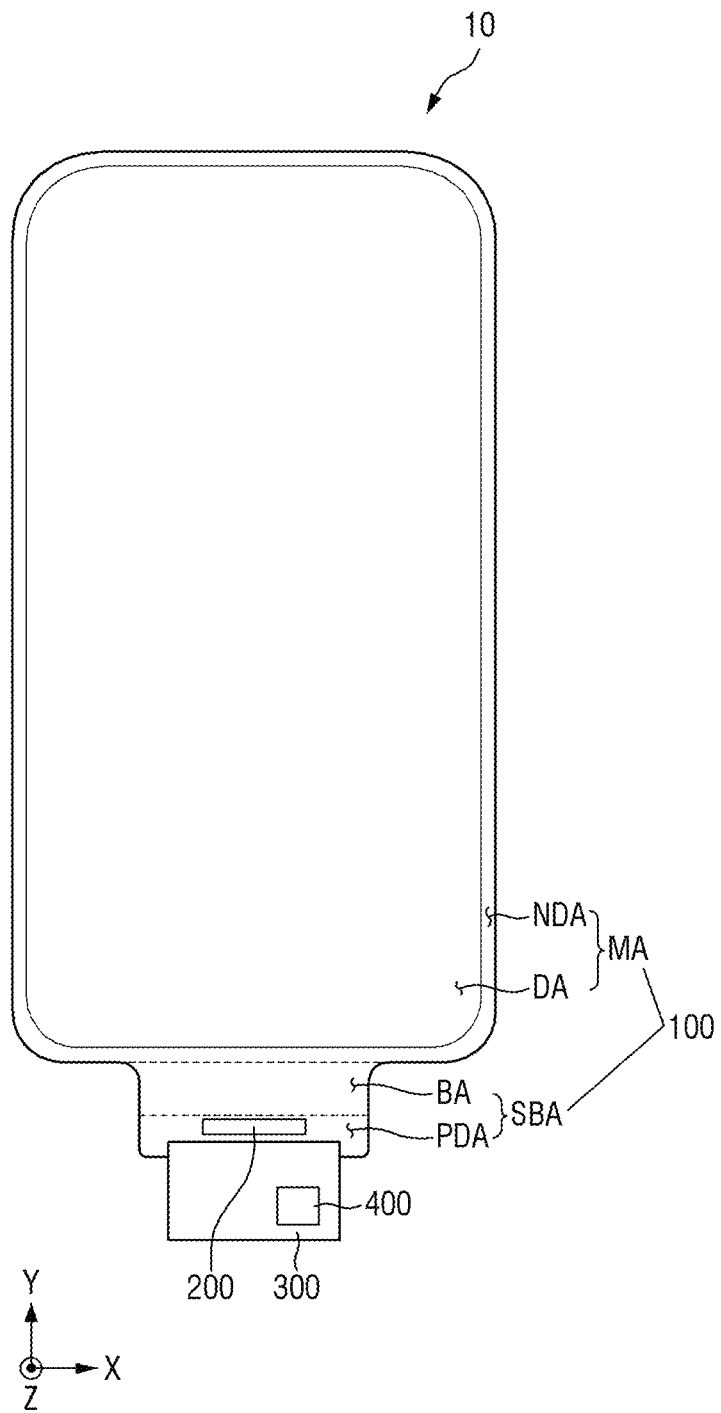
FIG. 2 is a plan view showing a display device according to an embodiment of the present disclosure.
Figure 3:
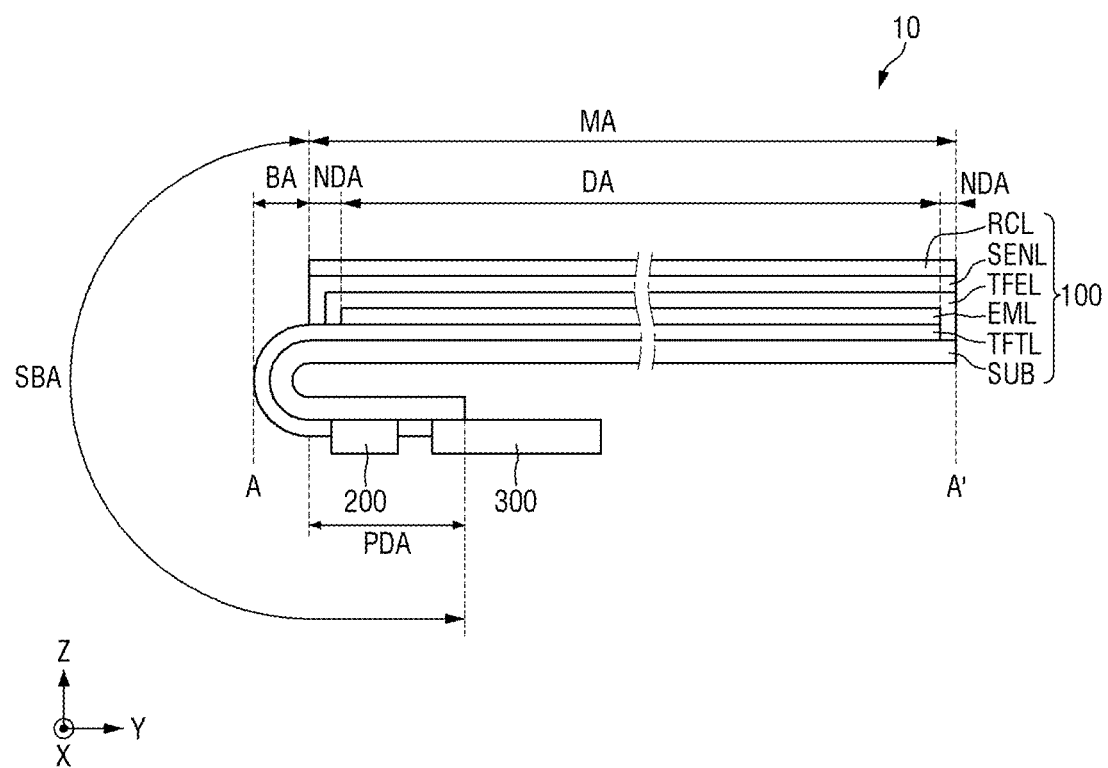
FIG. 3 is a side view showing a display device according to an embodiment of the present disclosure.

FIG. 1 is a perspective view showing a display device according to an embodiment of the present disclosure. FIG. 2 is a plan view showing a display device according to an embodiment of the present disclosure. FIG. 3 is a side view showing a display device according to an embodiment of the present disclosure.

Referring to FIGS. 1 to 3, a display device 10 according to an embodiment of the present disclosure may be employed by portable electronic devices such as a mobile phone, a smart phone, a tablet PC, a mobile communications terminal, an electronic notebook, an electronic book, a portable multimedia player (PMP), a navigation device and an ultra-mobile PC (UMPC). Alternatively, the display device 10 according to an embodiment of the present disclosure may be used as a display unit of a television, a laptop computer, a monitor, an electronic billboard, or the Internet of Things (JOT). Alternatively, the display device 10 according to the embodiment of the present disclosure may be applied to wearable devices such as a smart watch, a watch phone, a glasses-type display, and a head-mounted display (HMD) device. Alternatively, the display device 10 according to the embodiment may be used as a center information display (CID) disposed at the instrument cluster, the center fascia or the dashboard of a vehicle, as a room mirror display on the behalf of the side mirrors of a vehicle, as a display placed on the back of each of the front seats that is an entertainment system for passengers at the rear seats of a vehicle.

The display device 10 may be a light-emitting display device such as an organic light-emitting display device using organic light-emitting diodes, a quantum-dot light-emitting display device including quantum-dot light-emitting layer, an inorganic light-emitting display device including an inorganic semiconductor, and an ultra-small light-emitting display device using micro or nano light-emitting diodes (micro LEDs or nano LEDs). In the following description, an organic light-emitting display device is described as an example of the display device 10. It is, however, to be understood that the present disclosure is not limited thereto.

The display device 10 includes a display panel 100, a display driver circuit 200, a display circuit board 300 and a touch driver circuit 400.

The display panel 100 may be formed in a rectangular plane having shorter sides in a first direction (X-axis direction) and longer sides in a second direction (Y-axis direction) intersecting the first direction (X-axis direction). Each of the corners where the short side in the first direction (X-axis direction) meets the longer side in the second direction (Y-axis direction) may be rounded with a predetermined curvature or may be a right angle. The shape of the display panel 100 when viewed from the top is not limited to a quadrangular shape, but may be formed in a different polygonal shape, a circular shape, or an elliptical shape. The display panel 100 may be formed flat, but is not limited thereto. For example, the display panel 100 includes curved portions formed at left and right ends and having a constant curvature or a varying curvature. In addition, the display panel 100 may be formed to be flexible so that it can be curved, bent, folded, or rolled.

The display panel 100 includes a main area MA and a sub area SBA.

The main area MA includes a display area DA where images are displayed, and a non-display area NDA around the display area DA. The display area DA includes pixels PX (see FIG. 5) for displaying images. The sub area SBA may protrude from one side of the main area MA in a second direction (Y-axis direction).

Although the sub area SBA is unfolded in the example shown in FIGS. 1 and 2, the sub area SBA may be bent as shown in FIG. 3 and may be disposed on the lower surface of the display panel 100. When the sub area SBA is bent, it may overlap the main area MA in the thickness direction (z-axis direction) of the substrate SUB. The display driver circuit 200 may be disposed in the sub area SBA.

In addition, as shown in FIG. 3, the display panel 100 includes a substrate SUB, a thin-film transistor layer TFTL, a light emitting element layer EML, an encapsulation layer TFEL, a touch sensing layer SENL, and a reflection control layer RCL.

The thin-film transistor layer TFTL may be disposed on the substrate SUB. The thin-film transistor layer TFTL may be disposed in the main area MA and the sub area SBA. The thin-film transistor layer TFTL includes transistors ST1 (see FIG. 6).

The light emitting element layer EML may be disposed on the thin-film transistor layer TFTL. The light emitting element layer EML may be disposed in the display area DA of the main area MA. The light emitting element layer EML includes light-emitting elements disposed in emission areas.

The encapsulation layer TFEL may be disposed on the light emitting element layer EML. The encapsulation layer TFEL may be disposed in the display area DA and the non-display area NDA of the main area MA. The encapsulation layer TFEL includes at least one inorganic film and at least one organic film for encapsulating the light emitting element layer.

The touch sensing layer SENL may be disposed on the encapsulation layer TFEL. The touch sensing layer SENL may be disposed in the display area DA and the non-display area NDA of the main area MA. The touch sensing layer SENL may sense a touch of a person or an object using sensor electrodes.

The reflection control layer RCL may be disposed on the touch sensing layer SENL. The reflection control layer RCL may be disposed in the display area DA and the non-display area NDA of the main area MA. The reflection control layer RCL may be an anti-reflection member for reducing reflection of external light from metal lines and metal electrodes of the display panel 100. The reflection control layer RCL will be described in detail later.

A cover window for protecting the display panel 100 from above may be disposed on the reflection control layer RCL. The cover window may be attached on the reflection control layer RCL by a transparent adhesive member such as an optically clear adhesive (OCA) film and an optically clear resin (OCR). The cover window may be an inorganic material such as glass, or an organic material such as plastic and polymer material.

The display driver circuit 200 may generate signals and voltages for driving the display panel 100. The display driving circuit 200 may be implemented as an integrated circuit (IC) and may be attached to the display panel 10 by a chip on glass (COG) technique, a chip on plastic (COP) technique, or an ultrasonic bonding. It is, however, to be understood that the present disclosure is not limited thereto. For example, the display driver circuit 200 may be attached on the display circuit board 300 by the chip-on-film (COF) technique.

The display circuit board 300 may be attached to one end of the sub area SBA of the display panel 100. Accordingly, the display circuit board 300 may be electrically connected to the display panel 100 and the display driver circuit 200. The display panel 100 and the display driver circuit 200 may receive digital video data, timing signals, and driving voltages through the display circuit board 300. The display circuit board 300 may be a flexible printed circuit board, a printed circuit board, or a flexible film such as a chip on film.

The touch driver circuit 400 may be disposed on the display circuit board 300. The touch driver circuit 400 may be implemented as an integrated circuit (IC) and may be attached on the display circuit board 300.

The touch driver circuit 400 may be electrically connected to the sensor electrodes of the touch sensing layer SENL of the display panel 100. The touch driver circuit 400 applies driving signals to the sensor electrodes of the touch sensing layer SENL and measures mutual capacitances of the sensor electrodes. The driving signals may have driving pulses. The touch driver circuit 400 can determine whether a user has touched or the presence of nearby object based on the mutual capacitances. A user's touch refers to that an object such as the user's finger or a pen is brought into contact with a surface of the display device 10 disposed on the touch sensing layer SENL. The user's near proximity refers to that an object such as the user's finger and a pen is hovering over a surface of the display device 10.

As shown in FIGS. 1 to 3, in order to reduce reflection of external light by metal lines and metal electrodes of the display panel 100, the display panel 100 includes the reflection control layer RCL. Accordingly, since it is not necessary to attach a separate anti-reflection member such as a polarizing plate on the display panel 100, the fabrication cost of the display device 10 can be reduced.

Figure 4:
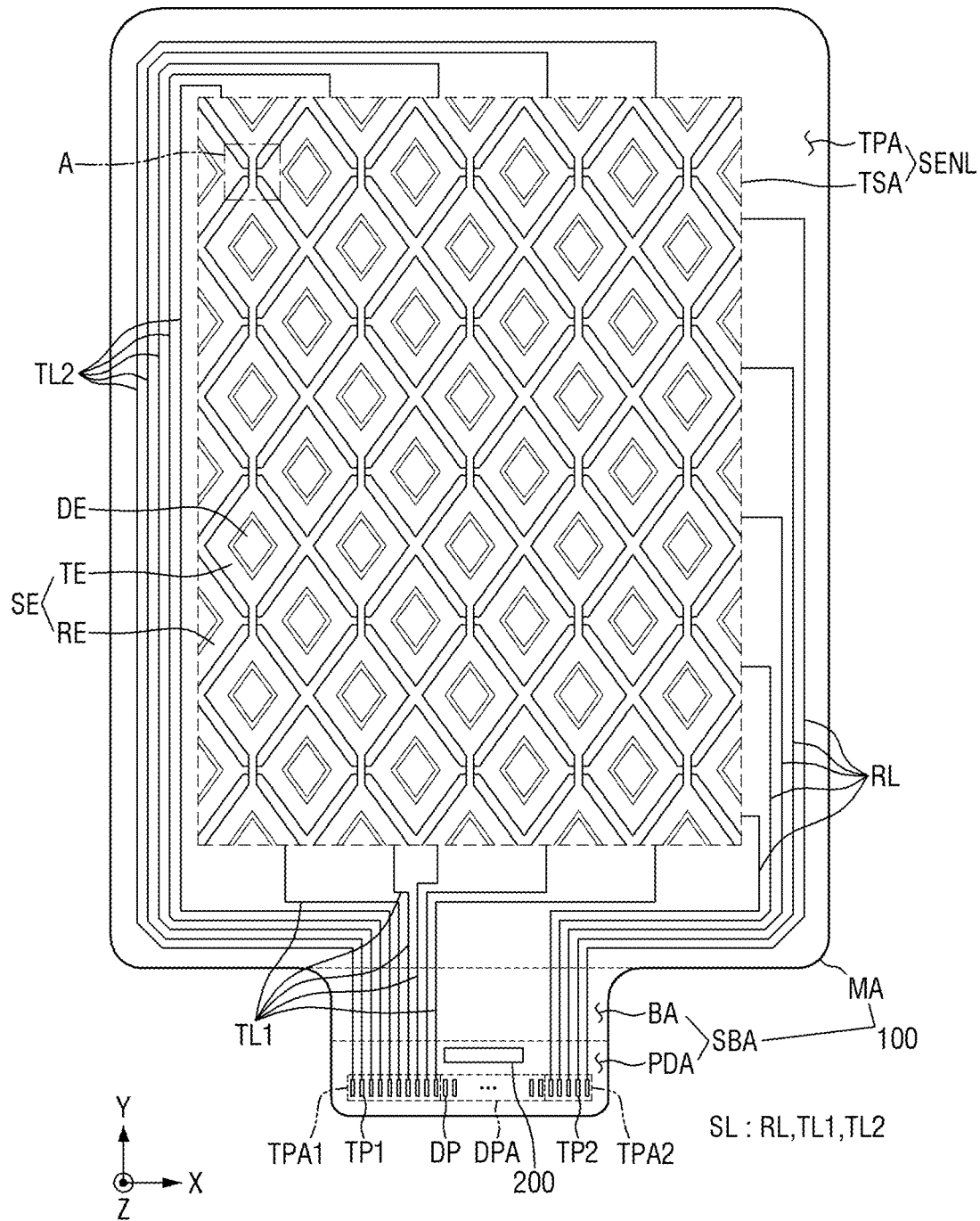
FIG. 4 is a layout view schematically showing an example of the touch sensing layer of FIG. 3.

FIG. 4 is a layout schematic view representing an example of the touch sensing layer of FIG. 3.

In the example shown in FIG. 4, the sensor electrodes SE of the touch sensing layer SENL include two kinds of electrodes, e.g., the driving electrodes TE and the sensing electrodes RE, the mutual capacitive sensing is carried out, i.e., driving signals are applied to the driving electrodes TE and then the voltages charged at the mutual capacitances can be sensed through the sensing electrodes RE. It is, however, to be understood that the present disclosure is not limited thereto.

For convenience of illustration, FIG. 4 shows only the driving electrodes TE, the sensing electrodes RE, dummy patterns DE, sensor lines TL1, TL2 and RL, and sensor pads TP1 and TP2.

Referring to FIG. 4, the touch sensing layer SENL includes a touch sensor area TSA for sensing a user's touch, and a touch peripheral area TPA disposed around the touch sensor area TSA. The touch sensor area TSA may overlap the display area DA of FIGS. 1 to 3, and the touch peripheral area TPA may overlap the non-display area NDA of FIGS. 1 to 3.

The touch sensor area TSA includes the driving electrodes TE, the sensing electrodes RE and the dummy patterns DE. The driving electrodes TE and the sensing electrodes RE may be electrodes for forming mutual capacitance to sense a touch of an object or a person.

The sensing electrodes RE may be arranged in the first direction (X-axis direction) and second direction (Y-axis direction). The sensing electrodes RE may be electrically connected to one another in the first direction (X-axis direction). The sensing electrodes RE may be connected to one another in the first direction (X-axis direction). The sensing electrodes RE adjacent to one another in the second direction (Y-axis direction) may be electrically separated from one another.

Figure 5:
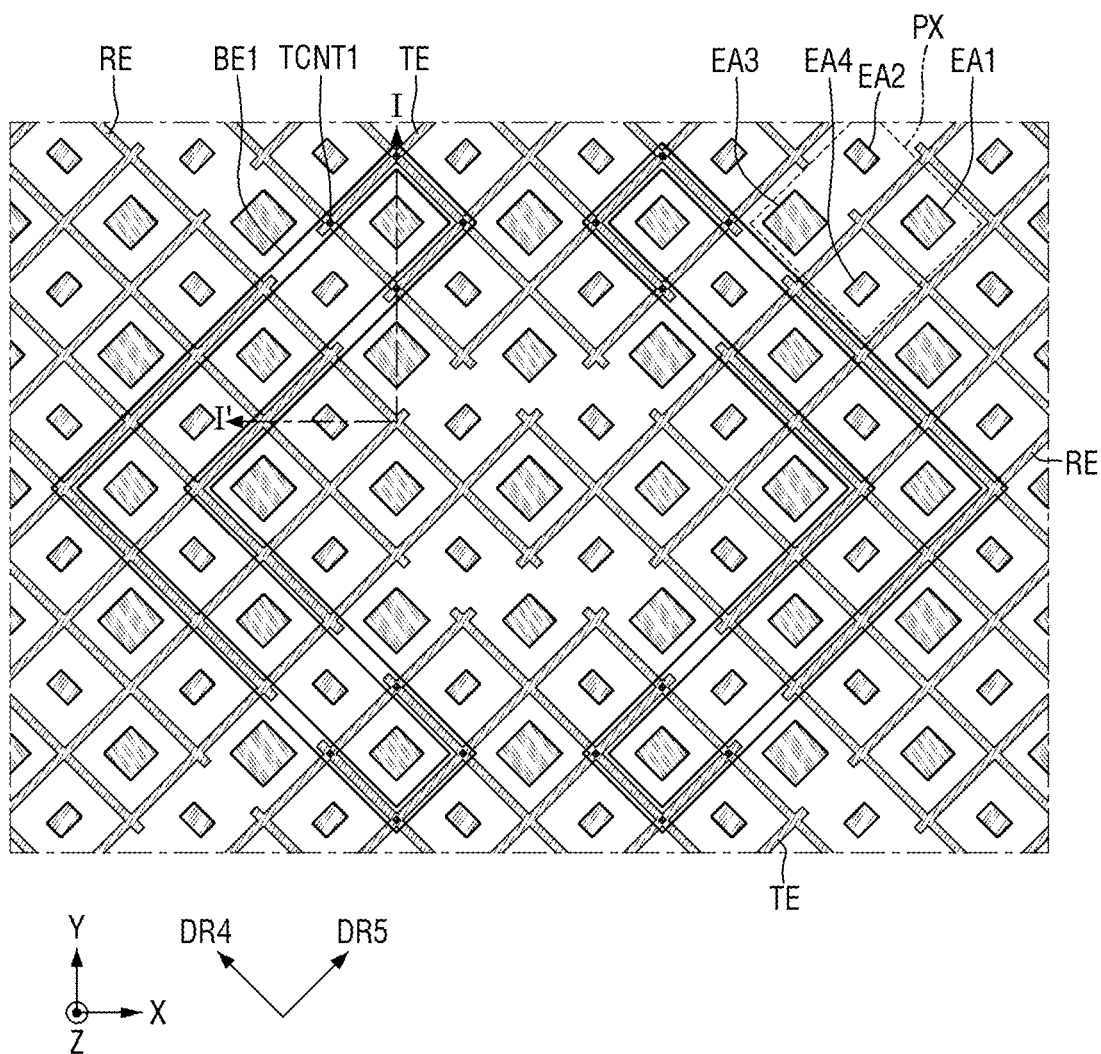
FIG. 5 is an enlarged plan view showing in detail an example of area A of FIG. 4.

The driving electrodes TE may be arranged in the first direction (X-axis direction) and second direction (Y-axis direction). The driving electrodes TE adjacent to one another in the first direction (X-axis direction) may be electrically separated from one another. The driving electrodes TE may be electrically connected to one another in the second direction (Y-axis direction). For example, the driving electrodes TE adjacent to one another in the second direction (Y-axis direction) may be connected through connection electrodes BE1 as shown in FIG. 5.

Each of the dummy patterns DE may be surrounded by the driving electrode TE or the sensing electrode RE. Each of the dummy patterns DE may be electrically separated from the driving electrode TE or the sensing electrode RE. Each of the dummy patterns DE may be spaced apart from the driving electrode TE or the sensing electrode RE. Each of the dummy patterns DE may be electrically floating.

In FIG. 4, the driving electrodes TE, the sensing electrodes RE and the dummy patterns DE each have a diamond shape when viewed from the top, but the present disclosure is not limited thereto. For example, each of the driving electrodes TE, the sensing electrodes RE and the dummy patterns DE may have other quadrangular shape than a diamond, other polygonal shapes than a quadrangular shape, a circle or an ellipse when viewed from the top.

The sensor lines TL1, TL2 and RL may be disposed in the sensor peripheral area TPA. The sensor lines TL1, TL2 and RL include sensing lines RL connected to the sensing electrodes RE, and first driving lines TL1 and second driving lines TL2 connected to the driving electrodes TE.

The sensing electrodes RE disposed on one side of the touch sensor area TSA may be connected to the sensing lines RL, respectively. For example, some of the sensing electrodes RE electrically connected in the first direction (X-axis direction) that are disposed at the right end may be connected to the sensing lines RL as shown in FIG. 4. The sensing lines RL may be connected to second sensor pads TP2, respectively. Thus, the touch driver circuit 330 may be electrically connected to the sensing electrodes RE.

The driving electrodes TE disposed on one side of the touch sensor area TSA may be connected to the first driving lines TL1, respectively, while the driving electrodes TE disposed on the other side of the touch sensor area TSA may be connected to the second driving lines TL2. For example, some of the driving electrodes TE electrically connected to one another in the second direction (Y-axis direction) on the lowermost side may be connected to the first driving line TL1, while some of the driving electrodes TE disposed on the uppermost side may be connected to the second driving line TL2, as shown in FIG. 4. The second driving lines TL2 may be connected to the driving electrodes TE on the upper side of the touch sensor area TSA via the left outer side of the touch sensor area TSA.

The first driving lines TL1 and the second driving lines TL2 may be connected to the first sensor pads TP1, respectively. Thus, the touch driver circuit 330 may be electrically connected to the driving electrodes TE. The driving electrodes TE are connected to the driving lines TL1 and TL2 on both sides of the touch sensor area TSA, and receive the touch driving signals. Therefore, it is possible to prevent a difference between the touch driving signals applied to the driving electrodes TE disposed on the lower side of the touch sensor area TSA and the touch driving signals applied to the driving electrodes TE disposed on the upper side of the touch sensor area TSA which occurs due to the RC delay of the touch driving signals.

The first sensor pad area TPA1 in which the first sensor pads TP1 are disposed may be disposed on one side of the display pad area DP in which the display pads DPA are disposed. The second sensor pad area TPA2 in which the second sensor pads TP1 are disposed may be disposed on the other side of the display pad area DPA. The display pads DP may be electrically connected to data lines of the display panel 100.

The display pad area DPA, the first sensor pad area TPA1 and the second sensor pad area TPA2 may correspond to the pads of the display panel 100 connected to the display circuit board 300 shown in FIG. 2. The display circuit board 300 may be disposed on the display pads DP, the first sensor pads TP1, and the second sensor pads TP2. The display pads DP, the first sensor pads TP1 and the second sensor pads TP2 may be electrically connected to the display circuit board 300 using a low-resistance, high-reliability material such as an anisotropic conductive film or an SAP. Therefore, the display pads DP, the first sensor pads TP1 and the second sensor pads TP2 may be electrically connected to the touch driver circuit 400 disposed on the display circuit board 300.

FIG. 5 is an enlarged plan view showing in detail an example of area A of FIG. 4.

Referring to FIG. 5, the driving electrodes TE and the sensing electrodes RE are formed on the same layer and thus they may be spaced apart from each other. That is to say, there may be a gap between adjacent ones of the driving electrodes TE and the sensing electrodes RE.

In addition, the dummy patterns DE may also be disposed on the same layer as the driving electrodes TE and the sensing electrodes RE. That is to say, there may be a gap between adjacent ones of the driving electrodes TE and the dummy patterns DE and between adjacent ones of the sensing electrodes RE and the dummy patterns DE.

The connection electrodes BE1 may be disposed on a different layer from the driving electrodes TE and the sensing electrodes RE. Each of the connection electrodes BE1 may be bent at least once. Although the connection electrodes BE1 have the shape of angle brackets "<" or ">" in the example shown in FIG. 5, the shape of the connection electrodes BE1 when viewed from the top is not limited thereto. Since the driving electrodes TE adjacent to each other in the second direction (Y-axis direction) are connected by the plurality of connection electrodes BE1, even if any of the connection electrodes BE1 is disconnected, the driving electrodes TE can still be stably connected with each other. Although two adjacent ones of the driving electrodes TE are connected by two connection electrodes BE1 in the example shown in FIG. 5, the number of connection electrodes BE1 is not limited to two.

The connection electrodes BE1 may overlap the driving electrodes TE adjacent to one another in the second direction (Y-axis direction) in the third direction (Z-axis direction), which is the thickness direction of the substrate SUB. The connection electrodes BE1 may overlap the sensing electrodes RE in the third direction (Z-axis direction). One side of each of the connection electrodes BE1 may be connected to one of the driving electrodes TE adjacent to each other in the second direction (Y-axis direction) through touch contact holes TCNT1. The other side of each of the connection electrodes BE1 may be connected to another one of the driving electrodes TE adjacent to each other in the second direction (Y-axis direction) through touch contact holes TCNT1.

The driving electrodes TE and the sensing electrodes RE may be electrically separated from each other at their intersections by virtue of the connection electrodes BE1. Accordingly, mutual capacitance can be formed between the driving electrodes TE and the sensing electrodes RE.

Each of the driving electrodes TE, the sensing electrodes RE and the connection electrodes BE1 may have a mesh structure or a net structure when viewed from the top. In addition, each of the dummy patterns DE may have a shape of a mesh structure or a net structure when viewed from the top. Accordingly, the driving electrodes TE, the sensing electrodes RE, the connection electrodes BE1 and the dummy patterns DE may not overlap with the emission areas EA1, EA2, EA3 and EA4 of each of the pixels PX. Therefore, it is possible to prevent the luminance of the lights emitted from the emission areas EA1, EA2, EA3 and EA4 from being lowered, which may occur as the lights are covered by the driving electrodes TE, the sensing electrodes RE, the connection electrodes BE1 and the dummy patterns DE.

Each of the pixels PX includes a first emission area EMA1 that emits light of a first color, a second emission area EMA2 that emits light of a second color, a third emission area EMA3 that emits light of a third color, and a fourth emission area EMA4 that emits light of the second color. For example, the first color may be red, the second color may be green, and the third color may be blue.

In each of the pixels PX, the first emission area EA1 and second emission area EA2 may be adjacent to each other in a fourth direction DR4, and the third emission area EA3 and the fourth emission area EA4 may be adjacent to each other in the fourth direction DR4. In each of the pixels PX, the first emission area EA1 and fourth emission area EA4 may be adjacent to each other in a fifth direction DR5, and the second emission area EA2 and the third emission area EA3 may be adjacent to each other in the fifth direction DR5.

Each of the first emission area EA1, the second emission area EA2, the third emission area EA3 and the fourth emission area EA4 may have, but is not limited to, a diamond or a rectangular shape when viewed from the top. Each of the first emission area EA1, the second emission area EA2, the third emission area EA3 and the fourth emission area EA4 may have other polygonal shape than a quadrangular shape, a circular shape, or an elliptical shape when viewed from the top. In addition, although the third emission area EA3 is the largest while the second emission area EA2 and the fourth emission area EA4 are the smallest in the example shown in FIG. 5, the present disclosure is not limited thereto.

The second emission areas EA2 and the fourth emission areas EA4 may be arranged in odd rows. The second emission areas EA2 and the fourth emission areas EA4 may be arranged side by side in each of the odd rows in the first direction (X-axis direction). The second emission areas EA2 and the fourth emission areas EA4 may be arranged alternately in odd rows. Each of the second emission areas EA2 may have shorter sides in the fourth direction DR4 and longer sides in the fifth direction DR5, while each of the fourth emission areas EA4 may have longer sides in the fourth direction DR4 and shorter sides in the fifth direction DR5. The fourth direction DR4 may refer to the direction between the first direction (X-axis direction) and the second direction (Y-axis direction), which be inclined from the first direction (X-axis direction) by forty-five degrees. The fifth direction DR5 may be a direction perpendicular to the fourth direction DR4.

The first emission areas EA1 and the third emission areas EA3 may be arranged in even rows. The first emission areas EA1 and the third emission areas EA3 may be arranged side by side in each of the even rows in the first direction (X-axis direction). The first emission areas EA1 and the third emission areas EA3 may be alternately arranged in each of the even rows.

The second emission areas EA2 and the fourth emission areas EA4 may be arranged in odd columns. The second emission areas EA2 and the fourth emission areas EA4 may be arranged side by side in each of the odd columns in the second direction (Y-axis direction). The second emission areas EA2 and the fourth emission areas EA4 may be arranged alternately in each of the odd columns.

The first emission areas EA1 and the third emission areas EA3 may be arranged in even columns. The first emission areas EA1 and the third emission areas EA3 may be arranged side by side in each of the even columns in the second direction (Y-axis direction). The first emission areas EA1 and the third emission areas EA3 may be alternately arranged in each of the even columns.

Figure 6:
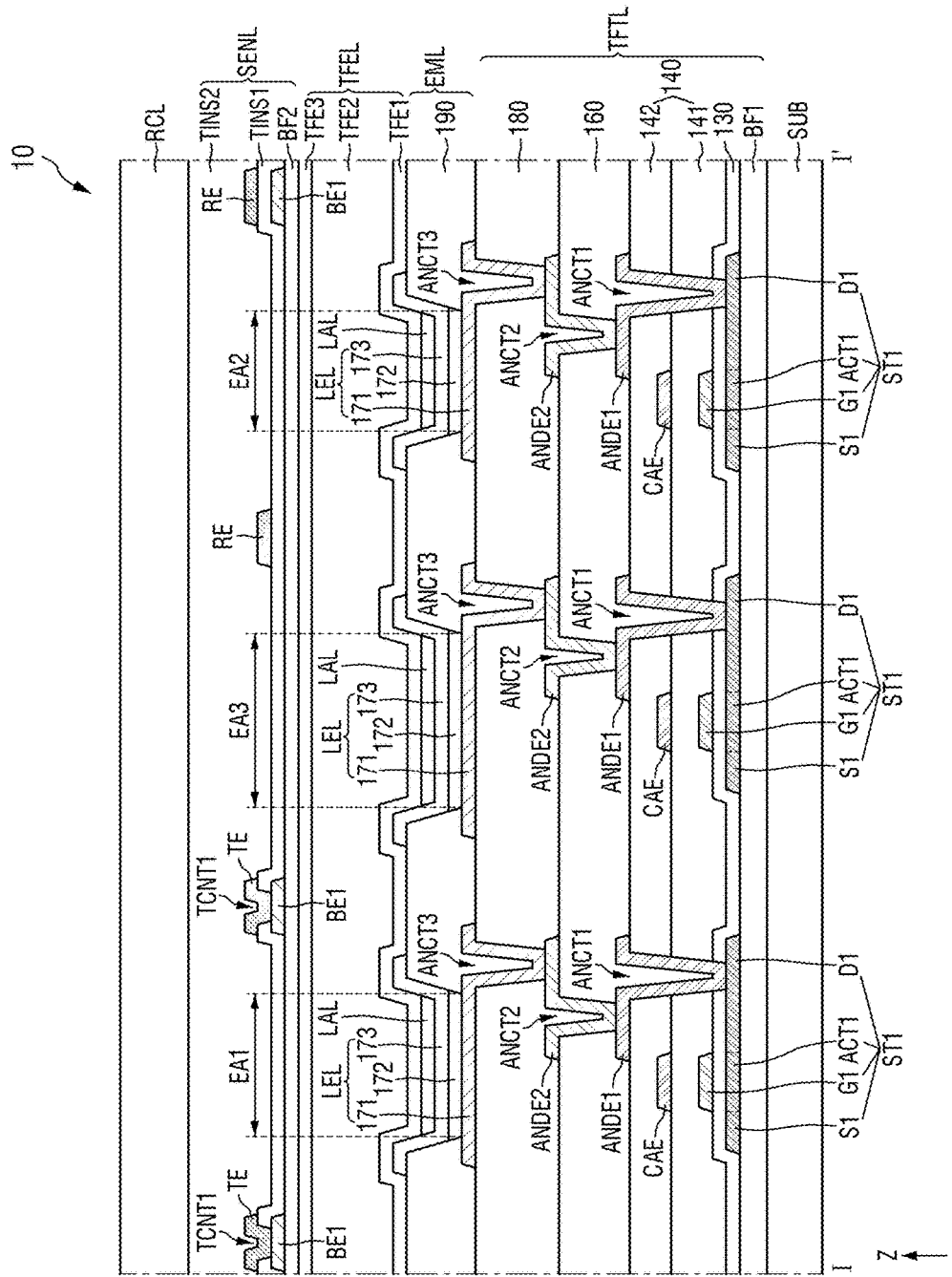
FIG. 6 is a cross-sectional view showing an example of the display panel, taken along line I-I' of FIG. 5.
Figure 7:
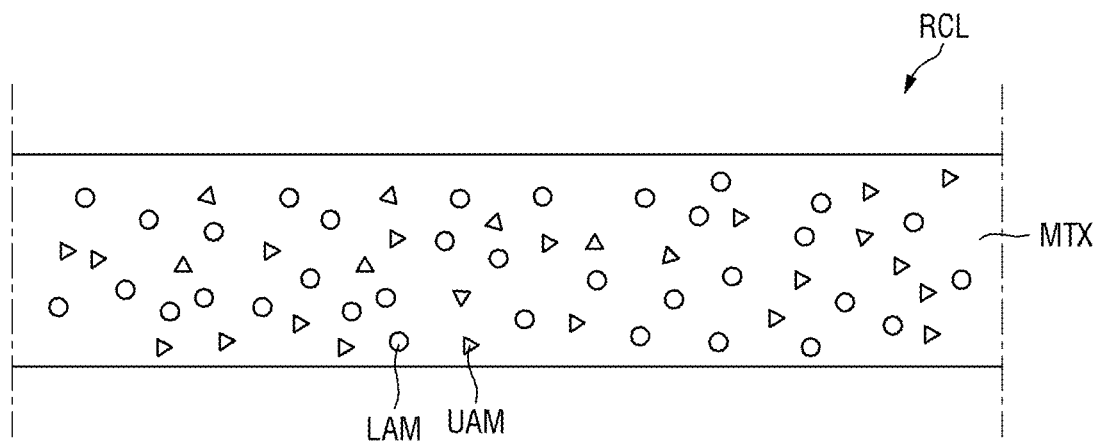
FIG. 7 is a cross-sectional schematic view showing a reflection control layer according to an embodiment.
Figure 8:
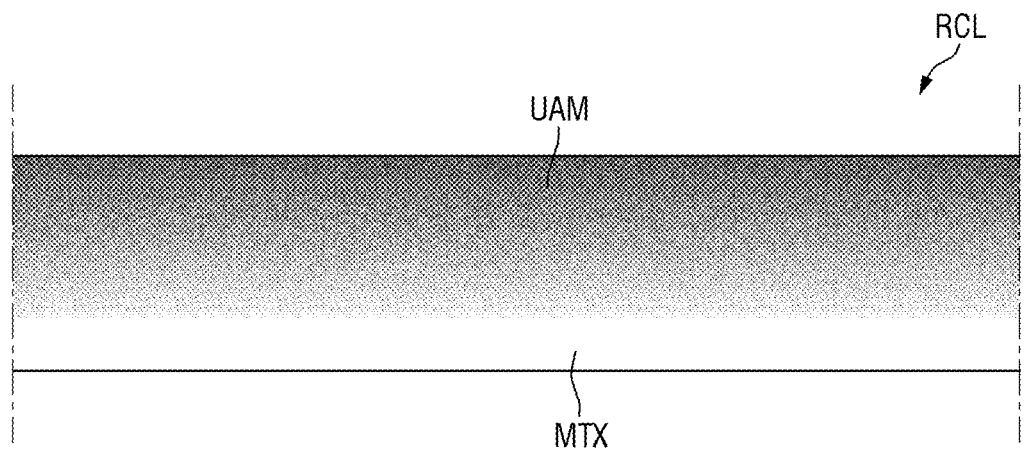
FIG. 8 is a cross-sectional schematic view showing a concentration gradient in the reflection control layer according to an embodiment.
Figure 9:
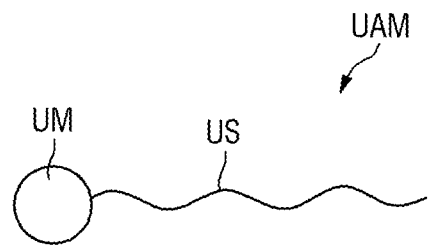
FIG. 9 is a schematic view a UV absorber of the reflection control layer according to the embodiment of the present disclosure.

FIG. 6 is a cross-sectional view showing an example of the display panel, taken along line I-I' of FIG. 5. FIG. 7 is a cross-sectional schematic view showing a reflection control layer according to an embodiment. FIG. 8 is a cross-sectional schematic view showing a reflection control layer according to an embodiment. FIG. 9 is a schematic view of a UV absorber of the reflection control layer according to the embodiment of the present disclosure.

Referring to FIG. 6, a first buffer layer BF1 may be disposed on the substrate SUB. The substrate SUB may be made of an insulating material such as a polymer. For example, the substrate SUB may be made of polyimide. The substrate SUB may be a flexible substrate that can be bent, folded, or rolled.

The first buffer layer BF1 is a layer for protecting the thin-film transistors of a thin-film transistor layer TFTL and a light emitting layer 172 of the light emitting element layer EML. The first buffer layer BF1 may be made up of multiple inorganic layers sequentially stacked on one another. For example, the first buffer layer BF1 may be made up of multiple layers in which one or more inorganic materials among silicon nitride, silicon oxide, silicon nitride, titanium oxide and aluminum oxide are alternately stacked on one another.

A transistor ST1 may be disposed on the first buffer layer BF1. The transistor ST1 includes an active layer ACT1, a gate electrode G1, a source electrode 51, and a drain electrode D1.

The active layer ACT1, the source electrode 51 and the drain electrode D1 of the transistor ST1 may be disposed on the first buffer layer BF1. The active layer ACT1 of the transistor ST1 includes polycrystalline silicon, single crystalline silicon, low-temperature polycrystalline silicon, amorphous silicon, or an oxide semiconductor.

A portion of the active layer ACT1 overlapping the gate electrode G1 in the third direction (z-axis direction) that is the thickness direction may be defined as a channel region. The source electrode 51 and the drain electrode D1 are regions that do not overlap with the gate electrode G1 in the third direction (z-axis direction), and may have conductivity by doping ions or impurities into a silicon semiconductor or an oxide semiconductor.

A gate insulating layer 130 may be disposed on the active layer ACT1, the source electrode 51 and the drain electrode D1 of the transistor ST1. The gate insulating layer 130 may be made of an inorganic layer, e.g., silicon nitride, silicon oxide, silicon nitride oxide, titanium oxide, or aluminum oxide.

The gate electrode G1 of the transistor ST1 may be disposed on the gate insulating layer 130. The gate electrode G1 may overlap the active layer ACT1 in the third direction (z-axis direction). The gate electrode G1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A first interlayer dielectric layer 141 may be disposed on the gate electrode G1 of the transistor ST1. The first interlayer dielectric layer 141 may be made of an inorganic layer, e.g., silicon nitride, silicon oxide, silicon nitride oxide, titanium oxide, or aluminum oxide. The first interlayer dielectric layer 141 may be made of a plurality of inorganic layers.

A capacitor electrode CAE may be disposed on the first interlayer dielectric layer 141. The capacitor electrode CAE may overlap the gate electrode G1 of the first transistor ST1 in the third direction (z-axis direction). Since the first interlayer dielectric layer 141 has a predetermined dielectric constant, a capacitor can be formed by the capacitor electrode CAE, the gate electrode G1, and the first interlayer dielectric layer 141 disposed between them. The capacitor electrode CAE may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second interlayer dielectric layer 142 may be disposed over the capacitor electrode CAE. The second interlayer dielectric layer 142 may be made of an inorganic layer, e.g., silicon nitride, silicon oxide, silicon nitride oxide, titanium oxide, or aluminum oxide, or a combination thereof. The second interlayer dielectric layer 142 may be made of a plurality of inorganic layers.

A first anode connection electrode ANDE1 may be disposed on the second interlayer dielectric layer 142. The first anode connection electrode ANDE1 may be connected to the drain electrode D1 of the transistor ST1 through a first connection contact hole ANCT1 that penetrates the gate insulating layer 130, the first interlayer dielectric layer 141 and the second interlayer dielectric layer 142. The first anode connection electrode ANDE1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A first planarization layer 160 may be disposed over the first anode connection electrode ANDE1 for providing a flat surface over level differences due to the transistor ST1. The first planarization layer 160 may be formed of an organic layer such as an acryl resin, an epoxy resin, a phenolic resin, a polyamide resin, or a polyimide resin.

A second anode connection electrode ANDE2 may be disposed on the first planarization layer 160. The second anode connection electrode ANDE2 may be connected to the first anode connection electrode ANDE1 through a second connection contact hole ANCT2 penetrating the first planarization layer 160. The second anode connection electrode ANDE2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second planarization layer 180 may be disposed on the second anode connection electrode ANDE2. The second planarization layer 180 may be formed as an organic layer such as an acryl resin, an epoxy resin, a phenolic resin, a polyamide resin, or a polyimide resin.

Light-emitting elements LEL and a bank 190 may be disposed on the second planarization layer 180. Each of the light-emitting elements LEL includes a pixel electrode 171, a light emitting layer 172, and a common electrode 173.

The pixel electrode 171 may be disposed on the second planarization layer 180. The pixel electrode 171 may be connected to the second anode connection electrode ANDE2 through a third connection contact hole ANCT3 penetrating the second planarization layer 180.

In the top-emission structure in which light exits from the light emitting layer 172 toward the common electrode 173, the pixel electrode 171 may be made of a metal material having a high reflectivity such as a stack structure of aluminum and titanium (Ti/Al/Ti), a stack structure of aluminum and indium tin oxide (ITO) (ITO/Al/ITO), an APC alloy and a stack structure of APC alloy and ITO (ITO/APC/ITO). The APC alloy is an alloy of silver (Ag), palladium (Pd) and copper (Cu).

In order to define the first emission area EA1, the second emission area EA2, the third emission area EA3 and the fourth emission area EA4 in FIG. 5, the bank 190 may be formed to partition the pixel electrode 171 on the second planarization layer 180. The bank 190 may be disposed to cover the edge of the pixel electrode 171. The bank 190 may be formed of an organic layer such as an acryl resin, an epoxy resin, a phenolic resin, a polyamide resin, or a polyimide resin.

In each of the first emission area EA1, the second emission area EA2, the third emission area EA3 and the fourth emission area EA4, the pixel electrode 171, the light emitting layer 172 and the common electrode 173 are stacked on one another sequentially, so that holes from the pixel electrode 171 and electrons from the common electrode 173 are combined with each other in the light emitting layer 172 to emit light.

The light emitting layer 172 may be disposed on the pixel electrode 171 and the bank 190. The light emitting layer 172 may include an organic material to emit light of a certain color. For example, the light emitting layer 172 may include a hole transporting layer, an organic material layer, and an electron transporting layer.

The common electrode 173 may be disposed on the light emitting layer 172. The common electrode 173 may be disposed to cover the light emitting layer 172. The common electrode 173 may be a common layer formed commonly in the first emission area EA1, the second emission area EA2, the third emission area EA3 and the fourth emission area EA4 of FIG. 5. A capping layer may be formed on the common electrode 173.

In the top-emission organic light-emitting diode, the common electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). When the common electrode 173 is formed of a semi-transmissive metal material, the light extraction efficiency can be increased by using microcavities.

The light emitting element layer EML may include a light-absorbing layer LAL disposed on the common electrode 173. The light-absorbing layer LAL may be disposed on the common layer in each of the first emission area EA1, the second emission area EA2, the third emission area EA3 and the fourth emission area EA4 of FIG. 5. The light-absorbing layer LAL may be disposed in each of the first emission area EA1, the second emission area EA2, the third emission area EA3 and the fourth emission area EA4 of FIG. 5, and may be spaced apart from another one. The light-absorbing layer LAL may absorb light to reduce reflection of external light. The light-absorbing layer LAL may include a metal and/or a metal oxide. For example, examples of the metal may include aluminum (Al), silver (Ag), magnesium (Mg), chromium (Cr), titanium (Ti), nickel (Ni), gold (Au), tantalum (Ta), copper (Cu), calcium (Ca), cobalt (Co), iron (Fe), molybdenum (Mo), tungsten (W), platinum (Pt), ytterbium (Yb), etc. Examples of the metal oxide may include silicon oxide, titanium oxide, zirconium oxide, tantalum oxide, hafnium oxide, aluminum oxide, zinc oxide, yttrium oxide, beryllium oxide, magnesium oxide, lead oxide, tungsten oxide, etc. In addition, the light-absorbing layer LAL may include silicon nitride, lithium fluoride, calcium fluoride, magnesium fluoride, cadmium sulfide, etc.

The encapsulation layer TFEL may be disposed on the light emitting element layer EML. The encapsulation layer TFEL includes at least one inorganic layer to prevent permeation of oxygen or moisture into the light emitting element layer EML. In addition, the encapsulation layer TFEL includes at least one organic layer to protect the light-emitting element layer EML from foreign substances such as dust. For example, the encapsulation layer TFEL includes a first inorganic encapsulation layer TFE1, an organic encapsulation layer TFE2 and a second inorganic encapsulation layer TFE3.

The first inorganic encapsulation layer TFE1 may be disposed on the light-absorbing layer LAL and the common electrode 173, the organic encapsulation layer TFE2 may be disposed on the first inorganic encapsulation layer TFE1, and the second inorganic encapsulation layer TFE3 may be disposed on the organic encapsulation layer TFE2. The first inorganic encapsulation layer TFE1 and the second inorganic encapsulation layer TFE3 may be formed as multiple layers in which one or more inorganic materials of silicon nitride, silicon oxide, silicon nitride, titanium oxide, and aluminum oxide are alternately stacked on one another. The organic encapsulation layer TFE2 may be an organic layer such as an acryl resin, an epoxy resin, a phenolic resin, a polyamide resin, a polyimide resin, etc.

A touch sensing layer SENL may be disposed on the encapsulation layer TFEL. The touch sensing layer SENL includes a second buffer layer BF2, connection electrodes BE1 a first touch insulating layer TINS1, driving electrodes TE, sensing electrodes RE, and a second touch insulating layer TINS2.

The second buffer layer BF2 may be made of an inorganic layer, e.g., silicon nitride, silicon oxide, silicon nitride oxide, titanium oxide, or aluminum oxide, or a combination thereof. The connection electrodes BE1 may be disposed on the second buffer layer BF2. The connection electrode BE1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The first touch insulating layer TINS' is disposed over the connection electrodes BE1. The first touch insulating layer TINS1 may be made of an inorganic layer, e.g., silicon nitride, silicon oxide, silicon nitride oxide, titanium oxide, or aluminum oxide, or a combination thereof. Alternatively, the first touch insulating layer TINS1 may be formed of an organic layer such as an acryl resin, an epoxy resin, a phenolic resin, a polyamide resin, or a polyimide resin.

The driving electrodes TE and the sensing electrodes RE may be disposed on the first touch insulating layer TINS1. In addition to the driving electrodes TE and the sensing electrodes RE, the dummy patterns DE, the first driving lines TL1, the second driving lines TL2 and the sensing lines RL shown in FIG. 4 may be disposed on the first touch insulating layer TINS1.

The driving electrodes TE and the sensing electrodes RE may overlap with the connection electrodes BE1 in the third direction (z-axis direction). The driving electrodes TE may be connected to the connection electrodes BE1 through touch contact holes TCNT1 penetrating through the first touch insulating layer TINS'. The driving electrodes TE and the sensing electrodes RE may include a low reflective layer to reduce reflection of light incident from the outside.

The second touch insulating layer TINS2 is formed over the driving electrodes TE and the sensing electrodes RE. The second touch insulating layer TINS2 may provide a flat surface over level differences formed by the driving electrodes TE, the sensing electrodes RE and the connection electrodes BE1. The second touch insulating layer TINS2 may be formed of an organic layer such as an acryl resin, an epoxy resin, a phenolic resin, a polyamide resin, or a polyimide resin.

A reflection control layer RCL may be disposed on the touch sensing layer SENL. The reflection control layer RCL may be directly disposed on the entire upper surface of the touch sensing layer SENL. The reflection control layer RCL may overlap at least the entire display area DA, and may also overlap the non-display area NDA.

Referring to FIG. 7, the reflection control layer RCL can absorb light incident from the outside to reduce reflected light. The reflection control layer RCL may include a base material MTX mixed with absorbing members LAM to absorb light.

The base material MTX is the main material of the reflection control layer RCL, and may be formed as an organic layer such as an acryl resin, an epoxy resin, a phenolic resin, a polyamide resin, a polyimide resin, etc.

The absorbing members LAM can absorb light incident from the outside. The absorbing members LAM may selectively absorb light of certain wavelength bands among lights incident from the outside. For example, the absorbing members LAM may transmit light in a first wavelength range, a second wavelength range and a third wavelength range while selectively absorbing other wavelength ranges. Herein, the light in the first wavelength range may be green light, the light in the second wavelength range may be blue light, and the light in the third wavelength range may be red light.

The absorbing members LAM may include a dye. Examples of the dye may include one or more of a tetraazaporphyrin dye, porphyrin dye, oxazine dye, squarylium dye, triarylmethane dye, polymethine cyanine dye, anthraquinone dye, phthalocyanine dye, azo dyes, perylene dye, xanthene dye, diimmonium dye, or dipyrromethene dye, or a combination thereof. It should be understood that the present disclosure is not limited thereto. The absorbing members LAM may include a pigment or both a dye and a pigment. In addition, when the absorbing members LAM include more than one type of dye, light absorption performance can be greatly improved. Any material that can absorb light in a selected wavelength range can be used as the material of the absorbing member LAM, besides the above-described dyes or pigments.

In order to absorb light in a desired wavelength range, the content of the absorbing members LAM may be 0.001 weight percent (wt %) to 5 wt % based on the total weight of the reflection control layer RCL.

According to an embodiment of the present disclosure, the reflection control layer RCL includes the above-described base material MTX and absorbing members LAM, and may further include UV absorbers UAM.

Referring to FIGS. 8 and 9, the UV absorbers UAM are for reducing the damage to the reflection control layer RCL caused by sunlight and may absorb UV light. When the display device 10 is exposed to sunlight, the color reflected off the reflection control layer RCL becomes reddish, and thus the color of light emitted from the display device 10 changes and the transmittance of the light changes. In view of the above, according to an embodiment of the present disclosure, the reflection control layer RCL includes UV absorbers UAM so that damage caused by sunlight can be minimized.

According to an embodiment of the present disclosure, in order to form the UV absorbers UAM so that they are disposed at the upper portion in the reflection control layer RCL, i.e., the portion proximate to a cover layer or the external environment, the UV absorbers UAM may include at least one hydrophobic group US. When the UV absorbers UAM are disposed at the upper portion of the reflection control layer RCL, the RCL can effectively absorb UV light from sunlight incident on the upper portion of the reflection control layer RCL.

Each of the UV absorbers UAM according to the embodiment of the present disclosure may include a body UM and at least one hydrophobic group US coupled with the body UM.

The body UM is a compound capable of absorbing UV, and may include, for example, one or more of a benzophenone compound, a benzotriazole compound, a salicylate compound, a cyanoacrylate compound, or an oxanilide compound.

At least one hydrophobic group US may include one or more of an alkyl group or a fluoroalkyl group. When the hydrophobic group US includes an alkyl group, the alkyl group may include at least thirteen carbon atoms. The alkyl group may be linear or have some branching. When the alkyl group includes thirteen or more carbon atoms, hydrophobic character of a surface of the reflection control layer can be increased. The alkyl group may be represented by Formula 1:

$$CH_3-(CH_2)m- \hspace{2cm} \text{Formula 1}$$

where m is an integer equal to or greater than 12.

In addition, the hydrophobic group US may include an alkyl group including fluorine (F). The alkyl group including fluorine (F) may be a fluoroalkyl group. The fluoroalkyl group may mean that at least one hydrogen of the alkyl group is substituted. The fluoroalkyl group may be represented by Formula 2:

$$CF_3-(CF_2)m-(CH_2)n- \hspace{2cm} \text{Formula 2}$$

where (m+n) is an integer equal to or greater than 3.

Examples of the fluoroalkyl group are as follows, but are not limited thereto. In fact, any fluoroalkyl group represented by the above formula may be applied.

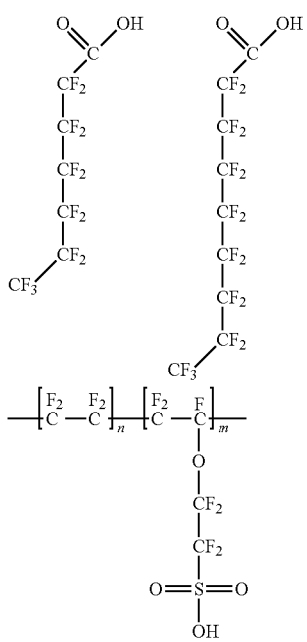

Each of m and n is an integer equal to or greater than 1.

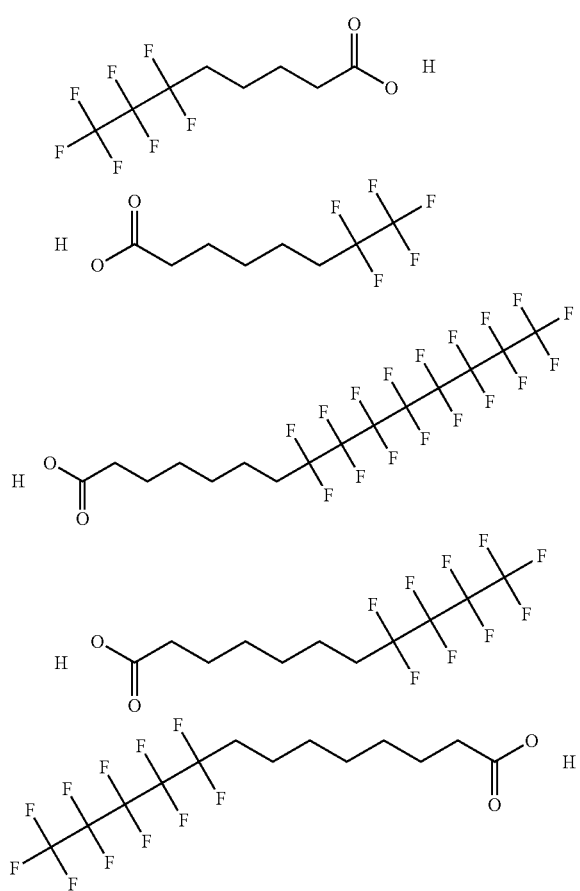

The UV absorber UAM having the hydrophobic group US coupled to the body UM may be, for example, represented by the chemical formulae as follows:

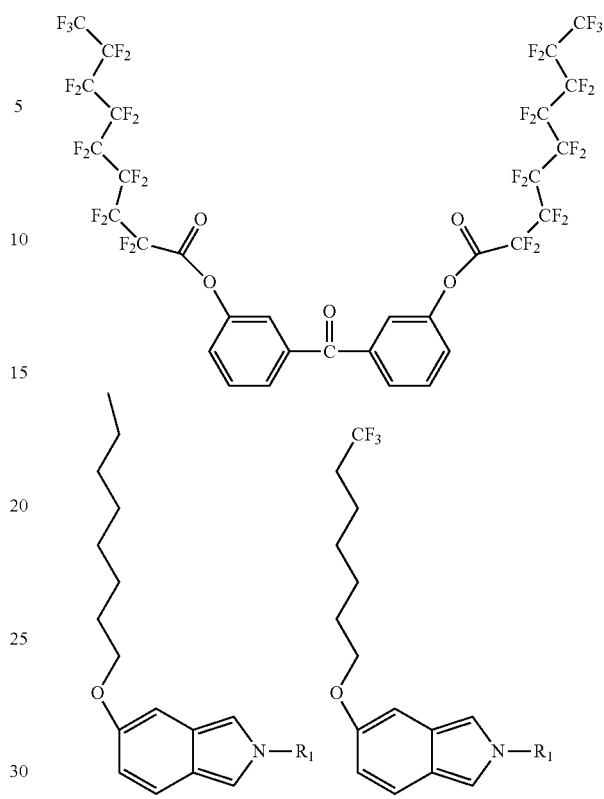

where R1 denotes hydrogen or an alkyl group.

The UV absorbers UAM having the hydrophobic groups US coupled to the body UM may be mixed with the absorbing members LAM in the base material MTX, to form the reflection control layer RCL.

As shown in FIG. 7, the absorbing members LAM may be evenly dispersed in the base material MTX. On the other hand, the UV absorbers UAM may be disposed in the base material MTX such that a concentration gradient of the UV absorbers increases from a lower portion proximate to the touch sensing layer to an upper portion of the reflection control layer RCL, as shown in FIG. 8 with the darker shading representative of greater concentrations of the UV absorber.

The term "gradient concentration" refers to a variation of UV absorber concentration from a surface of the reflection control layer to the opposite surface. The term means that the concentration of UV absorber proximate to one surface of the reflection control layer is greater or less than the concentration of UV absorber proximate to the opposite surface of the reflection control layer. Accordingly, the term "gradient concentration" includes a variable or random gradient concentration of UV absorber from one surface to an opposite surface as well as a concentration of UV absorber that varies in accordance with some linear or polynomial function.

Figure 10:
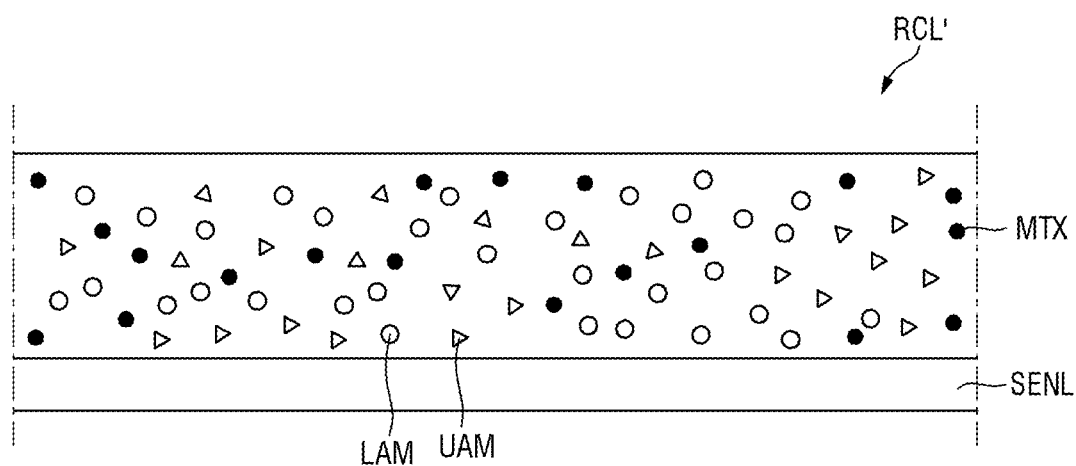
FIGS. 10 and 11 are cross-sectional views illustrating processing steps of fabricating the reflection control layer according to an embodiment of the present disclosure.
Figure 11:
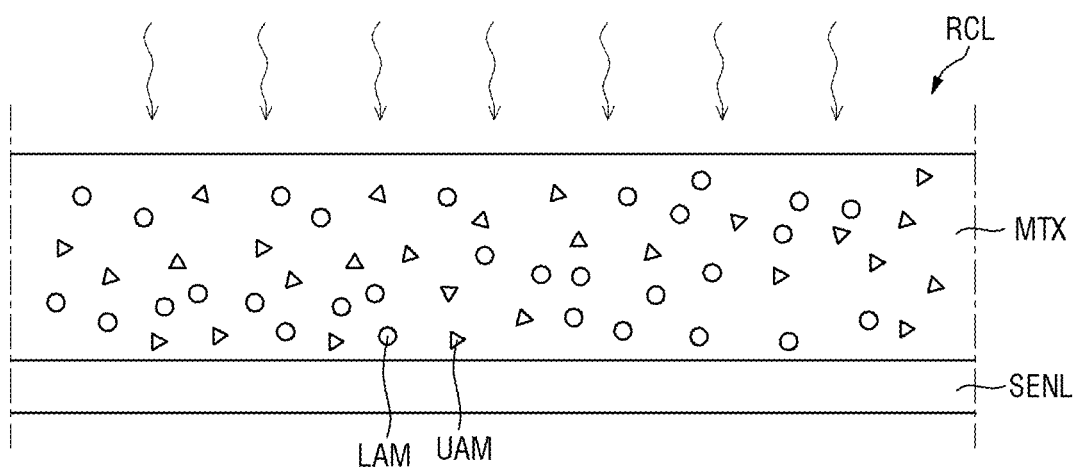

FIGS. 10 and 11 are cross-sectional schematics illustrating processing steps of fabricating the reflection control layer according to an embodiment of the present disclosure.

Referring to FIG. 10, a base material MTX, absorbing members LAM and UV absorbers UAM having a hydrophobic group coupled to a body UM are mixed in a solvent at predetermined contents, and then coated on the touch sensing layer SENL via a solution process to form the reflection control layer RCL. The UV absorbers UAM may be mixed to provide a range of 0.5 wt % to 5 wt % based on the total weight of the reflection control layer RCL. Following the coating of the mixture, the base material MTX, the absorbing members LAM and the UV absorbers UAM may be randomly and uniformly dispersed in the reflection control layer RCL.

Referring to FIG. 11, the solvent is removed by applying a primary heat treatment to the reflection control layer RCL. The primary heat treatment may be carried out for several seconds to several tens of seconds at a temperature of 100° C. or less. At this time, as the solvent is volatilized, the UV absorbers UAM having the hydrophobic groups coupled to the body diffuse upward in the reflection control layer RCL in a direction away from the touch sensing layer SENL by the hydrophobic groups. Accordingly, the UV absorbers UAM may have a concentration gradient that increases in a direction toward the upper portion of the reflection control layer RCL.

When the solvent is completely removed, the base material MTX becomes the body of the reflection control layer RCL, and the absorbing members LAM are evenly dispersed in the base material MTX. A subsequent secondary heat treatment is performed at a temperature of 100° C. or higher for several minutes to several tens of minutes to provide the reflection control layer RCL.

As described above, according to the embodiment of the present disclosure, a greater concentration of UV absorbers UAM can be positioned at the upper portion of the reflection control layer RCL without a separate mask process by coupling the hydrophobic groups to the UV absorbers UAM. Accordingly, the fabrication cost of the display device 10 can be reduced and the process can be simplified.

Figure 12:
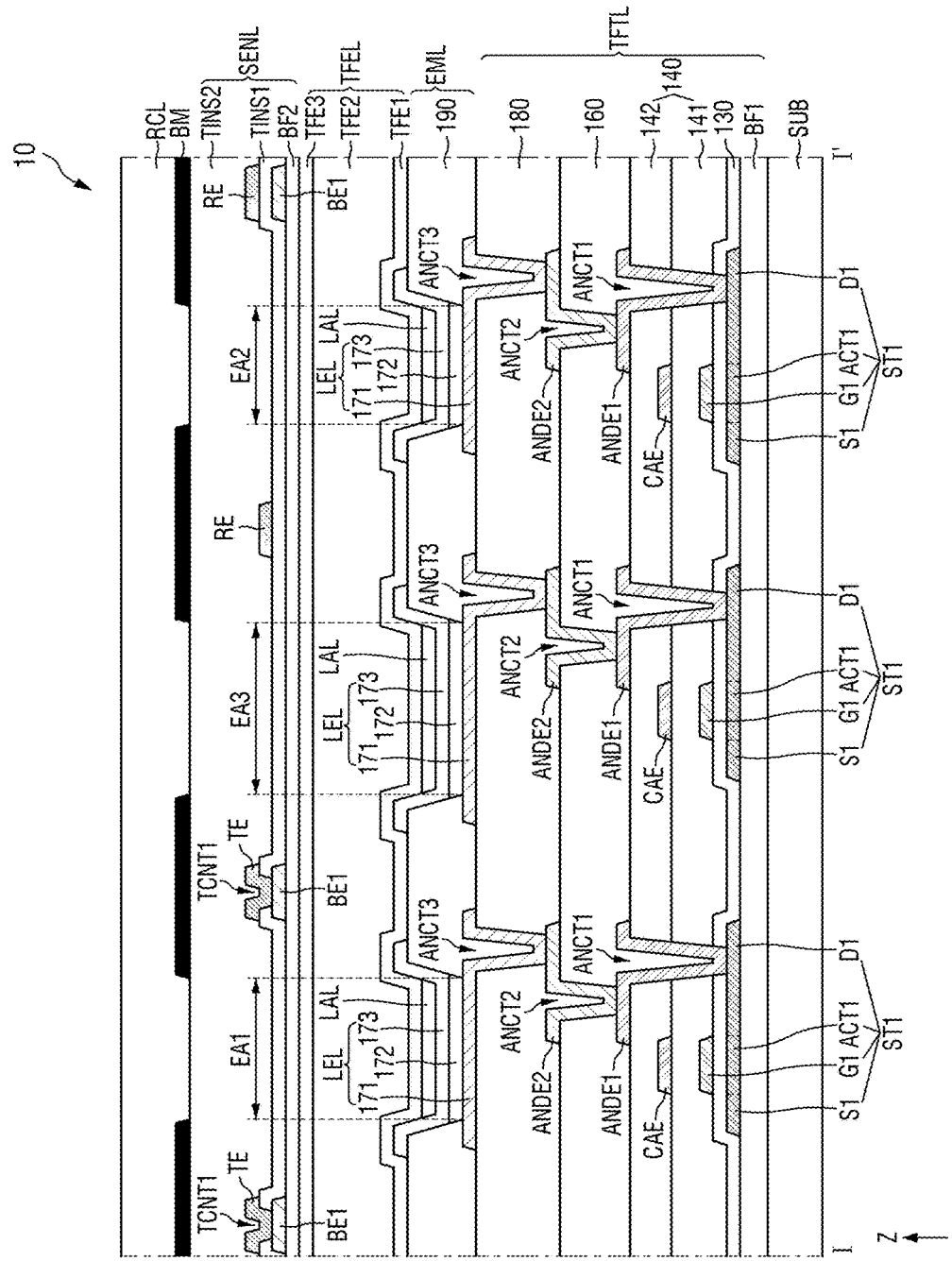
FIG. 12 is a cross-sectional schematic view showing a display device according to another embodiment.

FIG. 12 is a cross-sectional schematic view showing a display device according to another embodiment.

Referring to FIG. 12, a display device 10 may further include a patterned black matrix BM between a touch sensing layer SENL and a reflection control layer RCL. This embodiment is different from the above-described embodiment in that the black matrix BM is further included. In the following description, the description will focus on the difference and the redundant description will be omitted.

The patterned black matrix BM may be disposed between the touch sensing layer SENL and the reflection control layer RCL. The black matrix BM can absorb lights to prevent the lights between the emission areas EA1, EA2, EA3 and EA4 from being mixed, and may partition the emission areas EA1, EA2, EA3 and EA4. The black matrix BM may have a patterned shape including openings in line with the emission areas EA1, EA2, EA3 and EA4, respectively, and may have a mesh shape, for example. The black matrix BM may overlap with the bank 190.

According to this embodiment, the display device further includes the patterned black matrix BM between the touch sensing layer SENL and the reflection control layer RCL to absorb some light by the reflection control layer RCL to lower the reflectance out from the device. Moreover, the black matrix BM can also absorb some additional light to further lower the reflectance.

Hereinafter, the embodiments will be described in more detail with reference to Examples and Experimental Examples.

Example 1: Production of Reflection Control Layer I

An acrylic resin and absorbing members were mixed in a solvent, and the mixture was coated onto a substrate. A primary and secondary heat treatments were performed to produce reflection control layer sample #1.

Reflection control layer sample #2 was produced in accordance with sample #1 with the exception that UV absorber #1 (shown below) was also added in an amount of 1.5 wt % based on the total weight including the solvent of the mixture.

Reflection control layer sample #3 was produced in accordance with sample #1 with the exception that UV absorber #2 (shown below) was also added in an amount of 1.5 wt % based on the total solids content of the mixture.

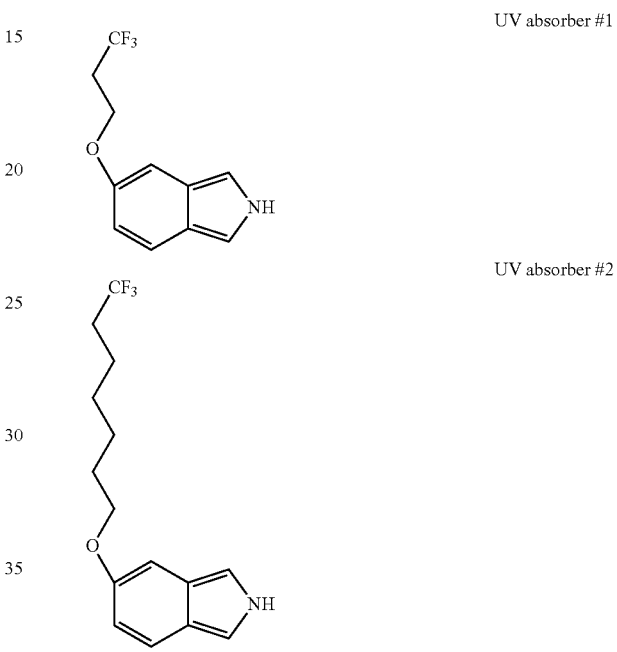

Experimental Example 1: Measurement of Contact Angle of Water

Figure 13:
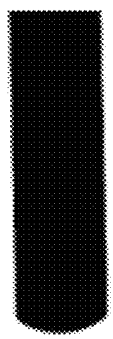
FIG. 13 is an image representing the contact angle of water in the reflection control layer of sample #1.
Figure 13:
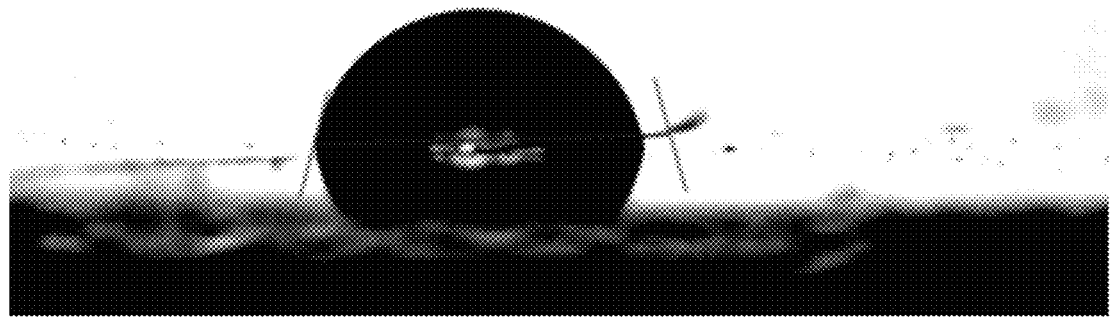
Figure 14:
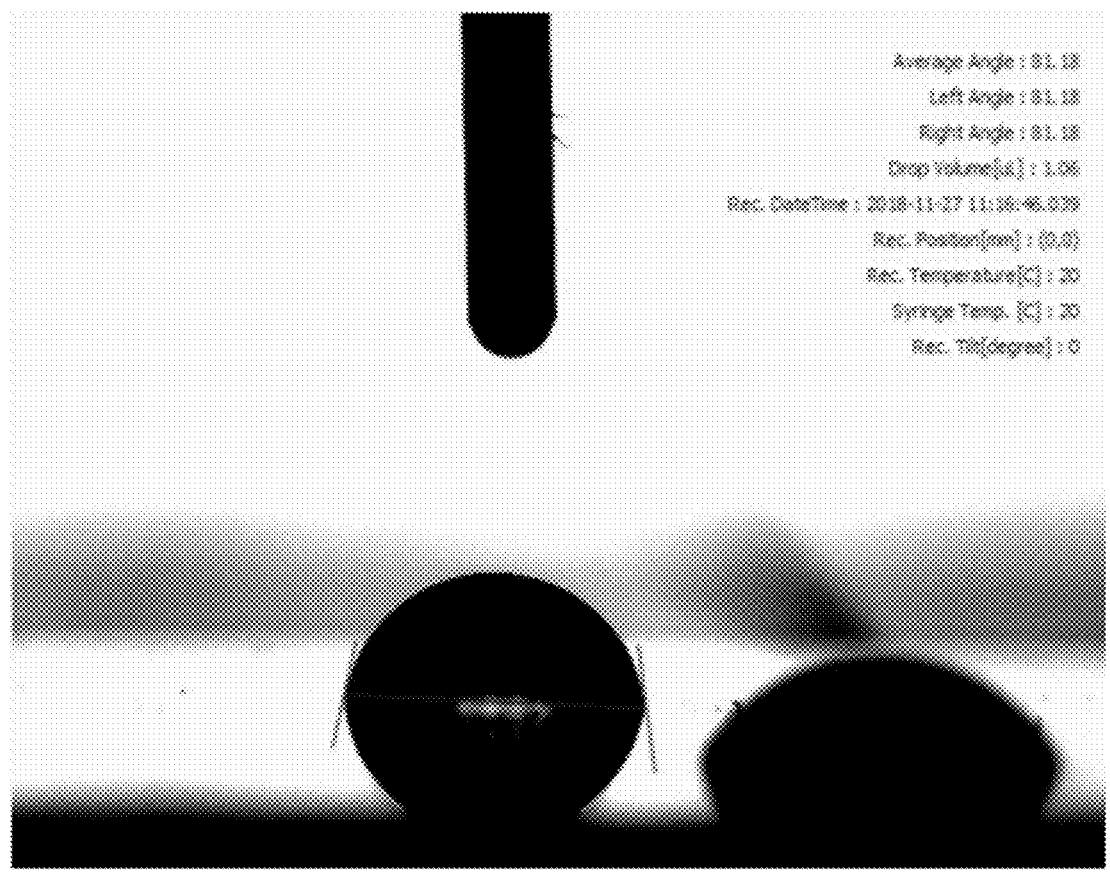
FIG. 14 is an image representing the contact angle of water in the reflection control layer sample #2.
Figure 15:
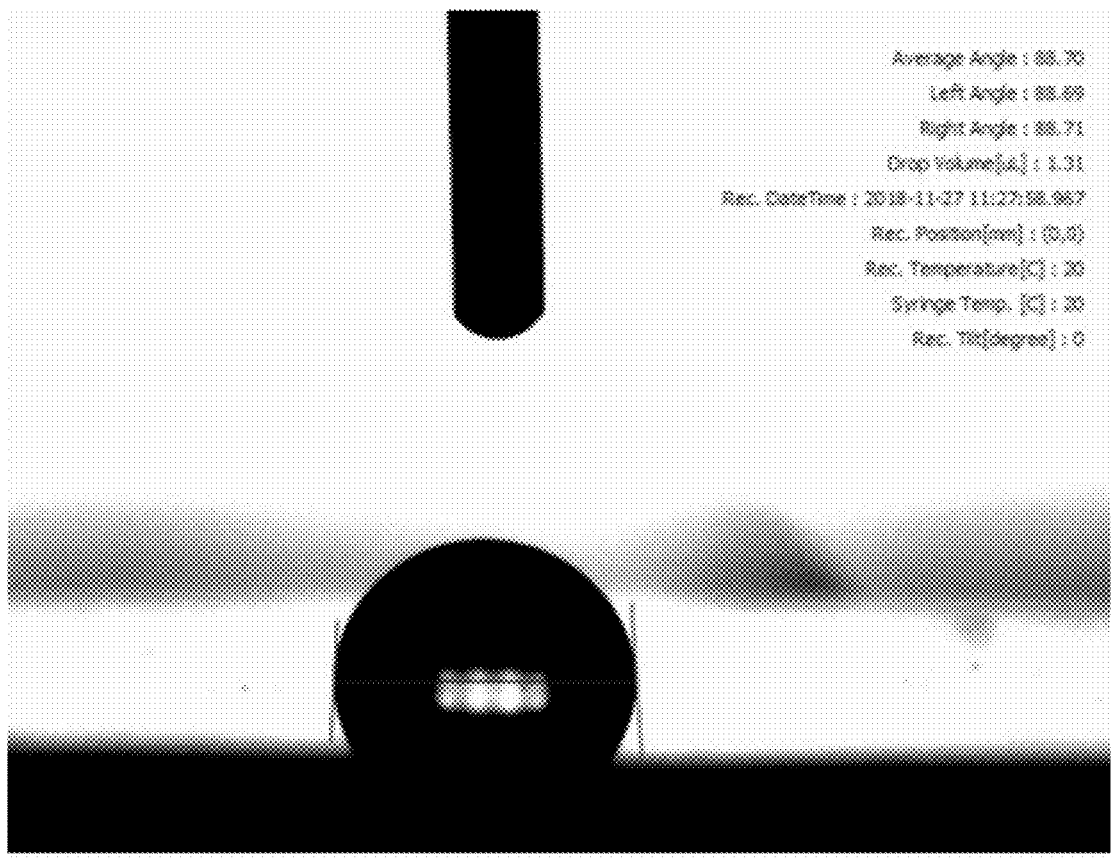
FIG. 15 is an image representing the contact angle of water in the reflection control layer sample #3.

The contact angle was measured by dripping water on the surface of each of the reflection control layer samples #1, #2, and #3. FIG. 13 is an image showing the contact angle of water in the reflection control layer sample #1. FIG. 14 is an image showing the contact angle of water in the reflection control layer sample #2. FIG. 15 is an image showing the contact angle of water in the reflection control layer sample #3.

Referring to FIGS. 13 to 15, the contact angle of the water in the reflection control layer sample #1 was 76 degrees, the contact angle of the water in the reflection control layer sample #2 was 81 degrees, and the contact angle of the water in the reflection control layer sample #3 was 89 degrees.

As compared with the reflection control layer sample #1, which does not include a UV absorber with a coupled hydrophobic group, the contact angle of the water in both samples #2 and #3, both of which do include UV absorbers with the coupled hydrophobic group, increases with an increase in the number of carbon atoms of the hydrophobic group. As a result, the reflection layers with the described UV absorbers #1 or #2, and in particular, UV absorber #2 with a longer carbon chain, the UV absorbers are concentrated at an upper portion of the reflection control layer as indicated by the greater hydrophilic character of the surface (i.e., by the larger water contact angle).

Example 2: Production of Reflection Control Layer II

Reflection control layer sample #4 was produced in accordance with sample #1, with the exception that a benzothiazole UV absorber without a long chain hydrophobic group was added to the mixture in an amount of 1.5 wt % based on the total solids content of the mixture.

Reflection control layer sample #5 was produced in accordance with the reflection control layer sample #1 with the exception that a polyimide resin was used instead of the acrylic resin.

Reflection control layer sample #6 was produced in accordance with the reflection control layer sample #4 with the exception that a polyimide resin was used instead of the acrylic resin.

Reflection control layer sample #7 was produced in accordance with the reflection control layer sample #3 with the exception that a polyimide resin was used instead of the acrylic resin.

Experimental Example 2: Measurement of UV-Visible Light Spectrum of Reflection Control Layer The initial ultraviolet-visible spectrum of each of the reflection control layer samples #1, #3, #4, #5, #6, and #7 were obtained at time zero (initial time), and then, each of the reflection control layer samples were irradiated with light for 80 hours at room temperature using the NVF403 solar lamp available from the Philips lighting Co. The ultraviolet-visible spectrum of each of the reflection control layer samples #1, #3, #4, #5, #6, and #7 was obtained following the irradiation with the solar lamp.

Figure 16:
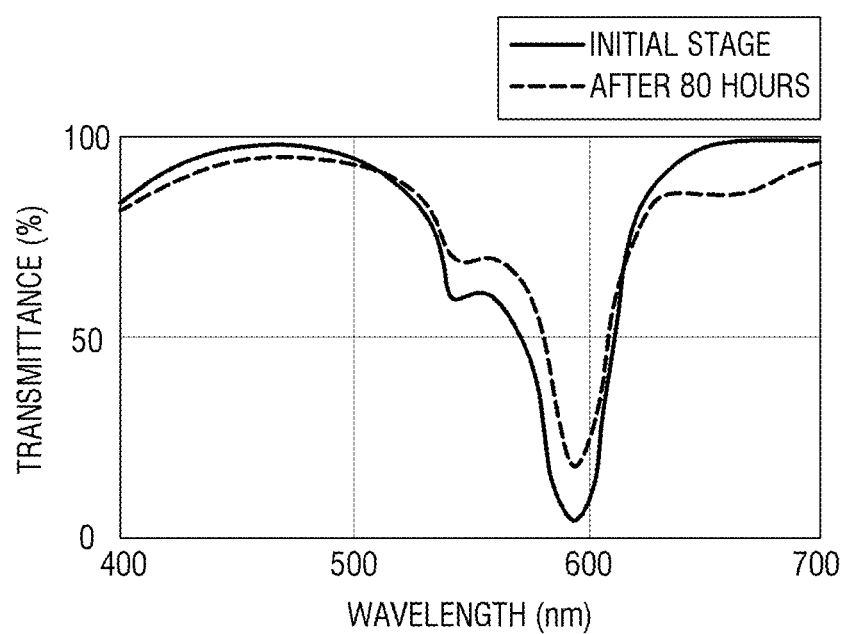
FIG. 16 is a graph showing the ultraviolet-visible spectrums of the reflection control layer sample #1 at the initial stage and after 80 hours.
Figure 17:
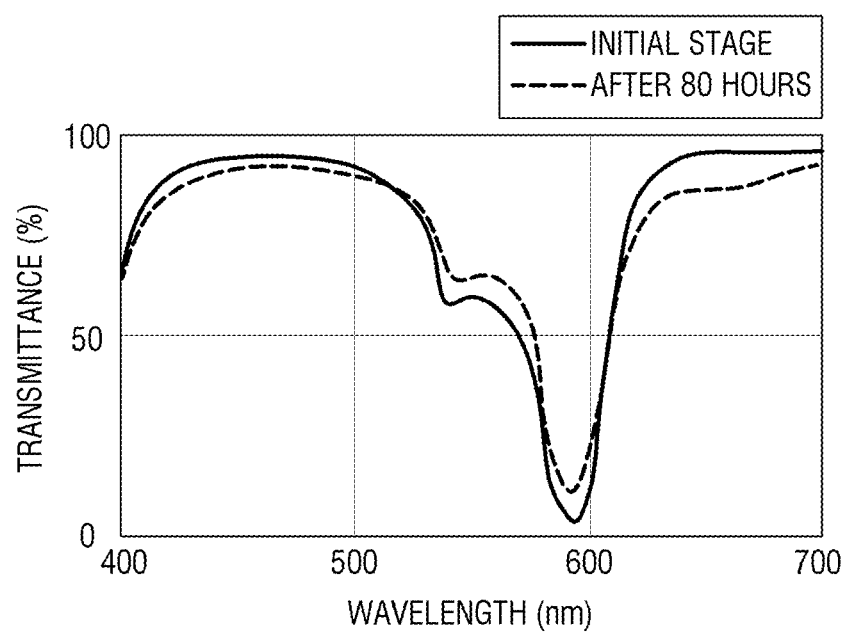
FIG. 17 is a graph showing the ultraviolet-visible spectrums of the reflection control layer sample #4 at the initial stage and after 80 hours.
Figure 18:
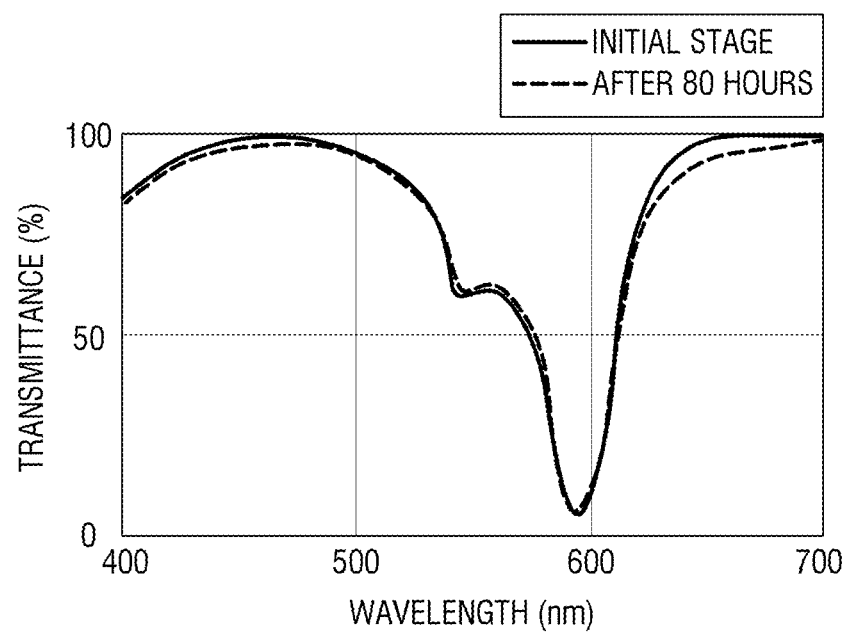
FIG. 18 is a graph showing the ultraviolet-visible spectrums of the reflection control layer sample #3 at the initial stage and after 80 hours.
Figure 19:
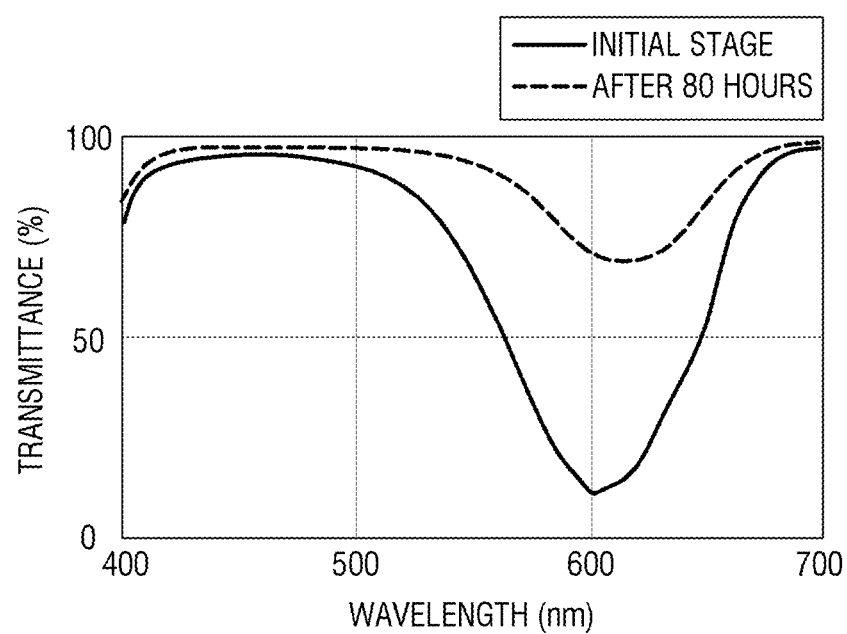
FIG. 19 is a graph showing the ultraviolet-visible spectrums of the reflection control layer sample #5 at the initial stage and after 80 hours.
Figure 20:
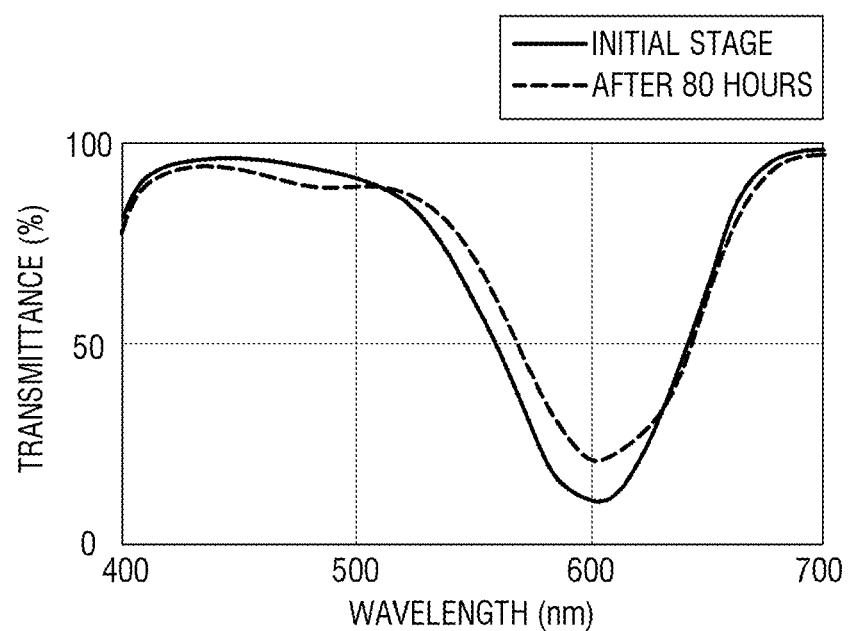
FIG. 20 is a graph showing the ultraviolet-visible spectrums of the reflection control layer sample #6 at the initial stage and after 80 hours.
Figure 21:
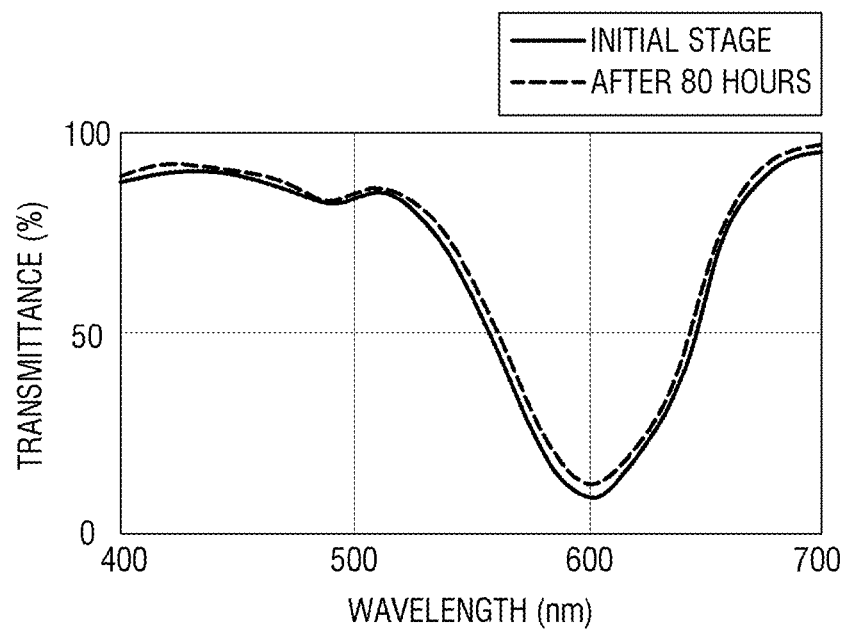
FIG. 21 is a graph showing the ultraviolet-visible spectrums of the reflection control layer sample #7 at the initial stage and after 80 hours.

FIG. 16 is a graph showing the ultraviolet-visible spectrums of the reflection control layer sample #1 at the initial stage and after 80 hours of irradiation with the solar lamp. FIG. 17 is a graph showing the ultraviolet-visible spectrums of the reflection control layer sample #4 at the initial stage and after 80 hours of irradiation with the solar lamp. FIG. 18 is a graph showing the ultraviolet-visible spectrums of the reflection control layer sample #3 at the initial stage and after 80 hours of irradiation with the solar lamp. FIG. 19 is a graph showing the ultraviolet-visible spectrums of the reflection control layer sample #5 at the initial stage and after 80 hours of irradiation with the solar lamp. FIG. 20 is a graph showing the ultraviolet-visible spectrums of the reflection control layer sample #6 at the initial stage and after 80 hours of irradiation with the solar lamp. FIG. 21 is a graph showing the ultraviolet-visible spectrums of the reflection control layer sample #7 at the initial stage and after 80 hours of irradiation with the solar lamp.

Referring to the spectra of FIG. 16, the reflection control layer sample #1 without the UV absorber exhibited a change in the minimum transmittance by approximately 13.9% after 80 hours of irradiation with the solar lamp. Referring to the spectra of FIG. 17, the reflection control layer sample #4 with uniformly mixed UV absorbers exhibited a change in the minimum transmittance by approximately 7.9% after 80 hours of irradiation with the solar lamp. Referring to the spectra of FIG. 18, the reflection control layer sample #3 with the UV absorbers having the hydrophobic groups exhibited a change in the minimum transmittance by approximately 2.1% after 80 hours of irradiation with the solar lamp. Herein, the minimum value of transmittance refers to the transmittance at a wavelength of approximately 595 to 600 nm.

It can be seen from the ultraviolet-visible spectrums of FIGS. 16 to 18 that the change in transmittance of reflection control layer sample #4 with the UV absorber is less than the change in transmittance of the reflection control layer sample #1 without UV absorber (the reflection control layer in each sample including the acrylic resin as the base material). In addition, the change in transmittance of the reflection control layer sample #3, which includes the UV absorber with the longer carbon chain hydrophobic group, was less than the change in transmittance of the reflection control layer sample #4 including the UV absorber, benzothiazole, with no hydrophobic group side chain (substituent).

In addition, referring to FIG. 19, the reflection control layer sample #5 without a UV absorber exhibited a change in the minimum transmittance by approximately 47.0% after 80 hours of irradiation with the solar lamp. Referring to FIG. 20, the reflection control layer sample #6 with evenly mixed UV absorber exhibited a change in the minimum transmittance by approximately 10.3% after 80 hours of irradiation with the solar lamp. Referring to FIG. 21, the reflection control layer sample #7 with the UV absorbers having the hydrophobic groups exhibited a change in the minimum transmittance by approximately 2.7% after 80 hours of irradiation with the solar lamp.

In addition, the ultraviolet-visible spectra of FIGS. 19 to 21 indicates that a change in the transmittance of the reflection control layer sample #6 with the UV absorbers is less than the change in the transmittance of reflection control layer sample #5 without UV absorber when the reflection control layer includes the polyimide as the base material. In addition, the change in transmittance of the reflection control layer sample #7 including the UV absorbers having the hydrophobic groups was less than the change in the transmittance of reflection control layer sample #6 including the UV absorbers without the hydrophobic groups.

In this manner, because the UV absorbers having the hydrophobic groups will tend to migrate to and become distributed at an upper portion in the reflection control layer, it is possible to reduce or minimize the change in transmittance of reflection control layers during or following exposure to sunlight.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
   a thin-film transistor layer disposed on a substrate;
   a light emitting element layer disposed on the thin-film transistor layer;
   a touch sensing layer disposed on the light emitting element layer; and
   a reflection control layer disposed on the touch sensing layer, wherein the reflection control layer comprises an UV absorber with at least one hydrophobic group,
   wherein the UV absorber includes a body having the at least one hydrophobic group coupled to the body, and the body comprises one or more of a benzophenone compound, a benzotriazole compound, a salicylate compound, a cyanoacrylate compound, or an oxanilide compound.

2. The display device of claim 1, wherein the reflection control layer comprises an absorbing member comprising at least one of a dye or a pigment.

3. The display device of claim 1, wherein the at least one hydrophobic group comprises at least one of an alkyl group or a fluoroalkyl group.

4. The display device of claim 3, wherein the alkyl group is represented by Formula 1:

$$CH_3-(CH_2)m- \qquad \text{Formula 1}$$

wherein m is an integer equal to or greater than 12.

5. The display device of claim 3, wherein the fluoroalkyl group is represented by Formula 2:

$$CF_3-(CF_2)m-(CH_2)n- \qquad \text{Formula 2}$$

wherein (m+n) is an integer equal to or greater than 3.

6. The display device of claim 1, wherein the UV absorber is present in a range of 0.5 weight percent to 5 weight percent based on the total weight of the reflection control layer.

7. The display device of claim 1, wherein the UV absorber is present as a concentration gradient in the reflection control layer, and the concentration of the UV absorber increases in a direction away from the touch sensing layer.

8. The display device of claim 1, further comprising a patterned black matrix disposed between the touch sensing layer and the reflection control layer.

9. A display device comprising:
a thin-film transistor layer disposed on a substrate;
a light emitting element layer disposed on the thin-film transistor layer;
a touch sensing layer disposed on the light emitting element layer; and
a reflection control layer disposed on the touch sensing layer, wherein the reflection control layer comprises a UV absorber,
wherein the UV absorber is present as a concentration gradient in the reflection control layer, the concentration of the UV absorber increases in a direction away from the touch sensing layer, and
wherein the light emitting element layer comprises a pixel electrode disposed on the thin-film transistor layer, a light emitting layer disposed on the pixel electrode, a common electrode disposed on the light emitting layer, and a light-absorbing layer disposed on the common electrode.

10. The display device of claim 9, wherein the reflection control layer is disposed on an entire upper surface of the touch sensing layer.

11. The display device of claim 9, wherein the light-absorbing layer comprises a metal or a metal oxide.

12. The display device of claim 9, wherein further comprising an encapsulation layer disposed between the light emitting layer and the touch screen layer, wherein the encapsulation layer comprises a first inorganic encapsulation layer disposed on the common electrode and the light-absorbing layer, an organic encapsulation layer disposed on the first inorganic encapsulation layer, and a second inorganic encapsulation layer disposed on the organic encapsulation layer.

13. The display device of claim 12, wherein the touch sensing layer is disposed on the second inorganic encapsulation layer and comprises a driving electrode, a sensing electrode, and a connection electrode.

14. The display device of claim 9, wherein the UV absorber includes a body and at least one hydrophobic group coupled to the body, wherein the body comprises: a benzophenone compound, a benzotriazole compound, a salicylate compound, a cyanoacrylate compound, or an oxanilide compound.

15. The display device of claim 14, wherein the at least one hydrophobic group comprises at least one of an alkyl group or a fluoroalkyl group.

16. The display device of claim 15, wherein the alkyl group is represented by Formula 1:

$$CH_3-(CH_2)m- \qquad \text{Formula 1}$$

wherein m is an integer equal to or greater than 12.

17. The display device of claim 15, wherein the fluoroalkyl group is represented by Formula 2:

$$CF_3-(CF_2)m-(CH_2)n- \qquad \text{Formula 2}$$

wherein (m+n) is an integer equal to or greater than 3.

18. The display device of claim 14, wherein the UV absorber is present in a range from 0.5 weight percent to 5 weight percent based on the total weight of the reflection control layer.

* * * * *